(12) United States Patent
Muta et al.

(10) Patent No.: US 9,835,948 B2
(45) Date of Patent: Dec. 5, 2017

(54) DEVELOPING METHOD, DEVELOPING APPARATUS, AND RECORDING MEDIUM

(71) Applicant: Tokyo Electron Limited, Tokyo (JP)

(72) Inventors: Koshi Muta, Koshi (JP); Hideharu Kyoda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/834,621

(22) Filed: Aug. 25, 2015

(65) Prior Publication Data

US 2016/0062240 A1    Mar. 3, 2016

(30) Foreign Application Priority Data

Aug. 28, 2014 (JP) .................. 2014-174133

(51) Int. Cl.
  *B05C 11/08* (2006.01)
  *G03F 7/30* (2006.01)
  *H01L 21/67* (2006.01)
  *B05D 1/00* (2006.01)
  *G06F 19/00* (2011.01)

(52) U.S. Cl.
  CPC ........ *G03F 7/3021* (2013.01); *H01L 21/6715* (2013.01); *B05C 11/08* (2013.01); *B05D 1/005* (2013.01); *G06F 19/00* (2013.01)

(58) Field of Classification Search
  CPC ... G03F 7/3021; H01L 21/6715; B05C 11/08; B05D 1/005; G06F 19/00

USPC .......... 430/434; 118/52, 320; 427/240, 425
See application file for complete search history.

(56) References Cited

U.S. PATENT DOCUMENTS

| | | | | |
|---|---|---|---|---|
| 5,783,367 A | * | 7/1998 | Maruyama | G03F 7/30 430/313 |
| 6,365,531 B1 | * | 4/2002 | Hayashi | H01L 21/02052 134/94.1 |
| 8,574,674 B2 | * | 11/2013 | Tanaka | G03F 7/162 118/313 |
| 2004/0029026 A1 | * | 2/2004 | Hayasaki | G03F 7/3021 430/30 |
| 2006/0003270 A1 | * | 1/2006 | Hoshika | G03F 7/3021 430/325 |
| 2009/0033898 A1 | * | 2/2009 | Yamamoto | G03B 27/42 355/53 |

FOREIGN PATENT DOCUMENTS

| | | |
|---|---|---|
| JP | 2000-147787 A | 5/2000 |
| JP | 3614769 B | 11/2004 |
| JP | 4893799 B | 1/2012 |

* cited by examiner

Primary Examiner — Kirsten Jolley
(74) Attorney, Agent, or Firm — Pearne & Gordon LLP

(57) ABSTRACT

A developing method can perform a developing process on a resist film that is exposed to light. The developing method includes forming a developing solution film by supplying a developing solution onto a surface of a substrate having thereon a resist film that is exposed to light; thinning the developing solution film by pushing out the developing solution containing components dissolved from the resist film; and supplying a new developing solution onto the thinned developing solution film.

15 Claims, 22 Drawing Sheets

DEVELOPING METHOD, DEVELOPING APPARATUS, AND RECORDING MEDIUM

CROSS-REFERENCE TO RELATED APPLICATION

This application claims the benefit of Japanese Patent Application No. 2014-174133 filed on Aug. 28, 2014, the entire disclosures of which are incorporated herein by reference.

TECHNICAL FIELD

The embodiments described herein pertain generally to a technique of performing a developing process by supplying a developing solution onto a substrate having thereon a resist film which has been exposed to light.

BACKGROUND

In a photolithography process in the course of manufacturing a semiconductor device, a resist pattern is formed by performing a developing process of supplying a developing solution on a substrate which has a resist film formed thereon and is exposed to light according to a preset pattern. As one of the developing methods, there is known a method in which a nozzle having a long discharge opening is used, and a developing solution puddle is formed by accumulating the developing solution on the entire substrate by moving the nozzle from one end of the substrate to the other end thereof while discharging the developing solution from the discharge opening. In this method, the developing solution can be accumulated on the substrate which is stopped, and thus, this developing method will be referred to as a stationary developing method. One example of such stationary developing method is described in Patent Document 1.

As another developing method, there is a method in which a supply position of the developing solution is moved along a radial direction of a substrate being rotated by moving a nozzle while rotating the substrate. Due to the movement of the supply position of the developing solution and an effect of a centrifugal force, a liquid film of the developing solution is formed on a surface of the substrate, and the developing solution forming the liquid film flows. Here, this developing method will be referred to as a rotational developing method. One example of this rotational developing method is described in Patent Document 2.

One example of a substrate which is developed through a developing process is a circular semiconductor wafer (hereinafter, simply referred to as "wafer"). A resist film formed on this wafer has various types. For example, there are a thick-film resist required for processing a target film having low selectivity when performing an etching process, a resist film for EUV (Extreme Ultraviolet) exposure having a low output of exposure, a resist film for ArF exposure or KrF exposure, and so forth.

Among these, for the resist film having low sensitivity, a contact time with the developing solution needs to be lengthened. In the aforementioned stationary developing method, a concentration of the developing solution is decreased by being affected by components dissolved in the developing solution during the developing process. As a result, reactivity of the developing solution diminishes, so that a processing time for the developing process is increased. Further, in the rotational developing method as well, a processing time required for the developing process or a consumption amount of the developing solution increases when processing the resist film having low sensitivity. Thus, there has been a demand for a more efficient developing method.

Patent Document 1: Japanese Patent Publication No. 3614769 (paragraphs [0044], [0058] and [0059], FIG. 1 and FIG. 3)

Patent Document 2: Japanese Patent Publication No. 4893799 (Paragraph [0026] and FIG. 8)

SUMMARY

In view of the foregoing problems, exemplary embodiments provide a developing method and a developing apparatus capable of developing an exposed resist film efficiently, and, also, provide a recording medium that stores the developing method therein.

In one exemplary embodiment, a developing method includes forming a developing solution film by supplying a developing solution onto a surface of a substrate having thereon a resist film that is exposed to light; thinning the developing solution film by pushing out the developing solution containing components dissolved from the resist film; and supplying a new developing solution onto the thinned developing solution film.

Further, the thinning of the developing solution film may be performed by discharging a gas onto a surface of the developing solution film. Moreover, the forming of the developing solution film and the thinning of the developing solution film may be performed together by supplying the developing solution onto the surface of the substrate being rotated about a vertical axis while moving a supply position of the developing solution along a radial direction of the substrate and by forming a flow of the developing solution pushed out from a central portion of the substrate toward a periphery thereof, and the supplying of the new developing solution may be subsequently performed by supplying the developing solution at an upstream position in a moving direction of the supply position of the developing solution. Here, in the supplying of the new developing solution, a supply position of the new developing solution may be moved in the same direction as the moving direction of the developing solution in the forming of the developing solution film and a moving speed of the supply position of the new developing solution may be set to be lower than that of the supply position of the developing solution.

According to the exemplary embodiments described above, the new developing solution is supplied after thinning the developing solution film supplied on the surface of the substrate having thereon the resist film exposed to light by pushing out the developing solution in the developing solution film. Accordingly, an efficient developing process can be performed using the developing solution film having high reactivity instead of the developing solution with reduced reactivity containing components dissolved from the resist film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art

DETAILED DESCRIPTION

Figure 1:
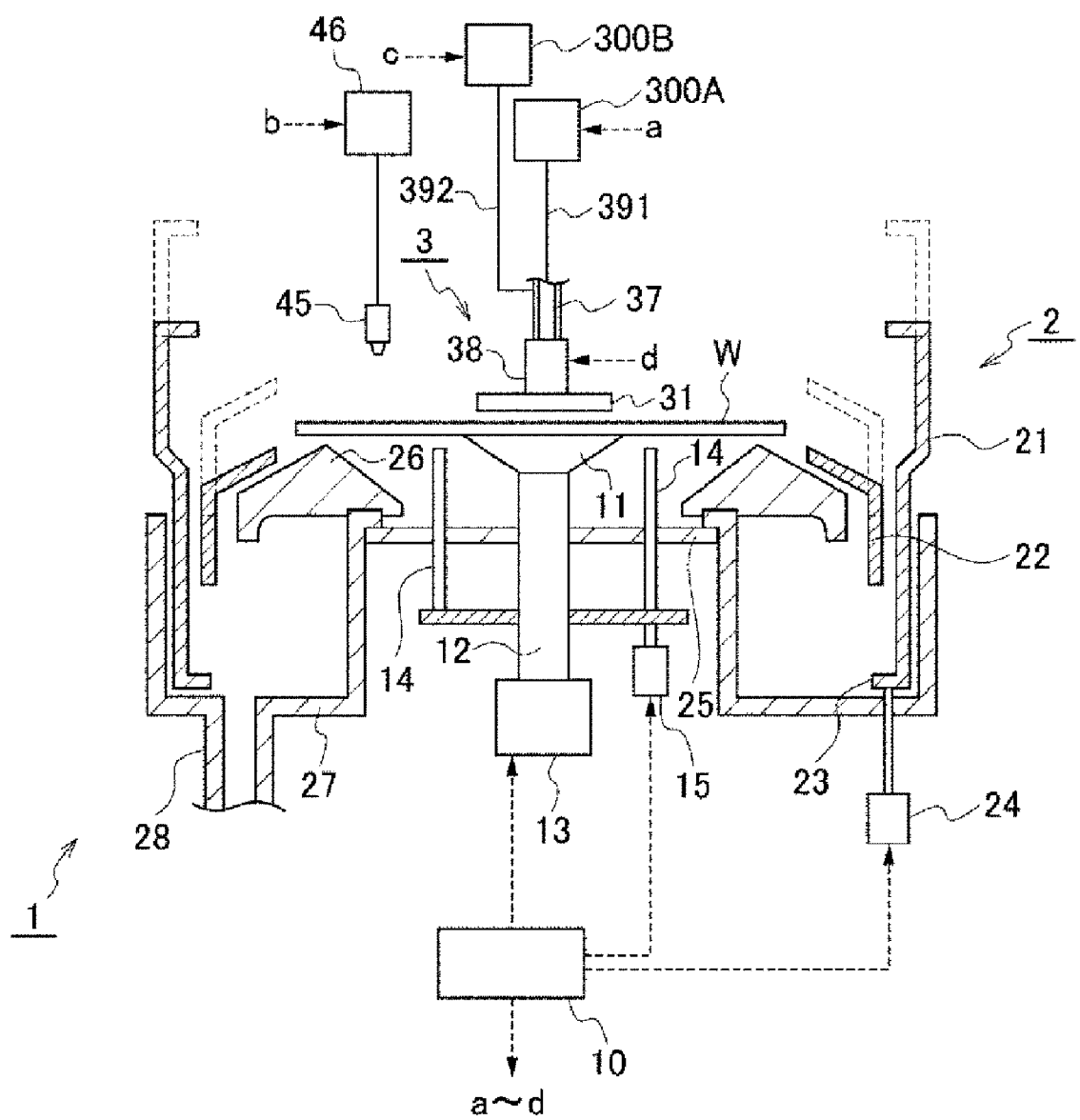
FIG. 1 is a longitudinal side view of a developing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Exemplary Embodiment

Figure 2:
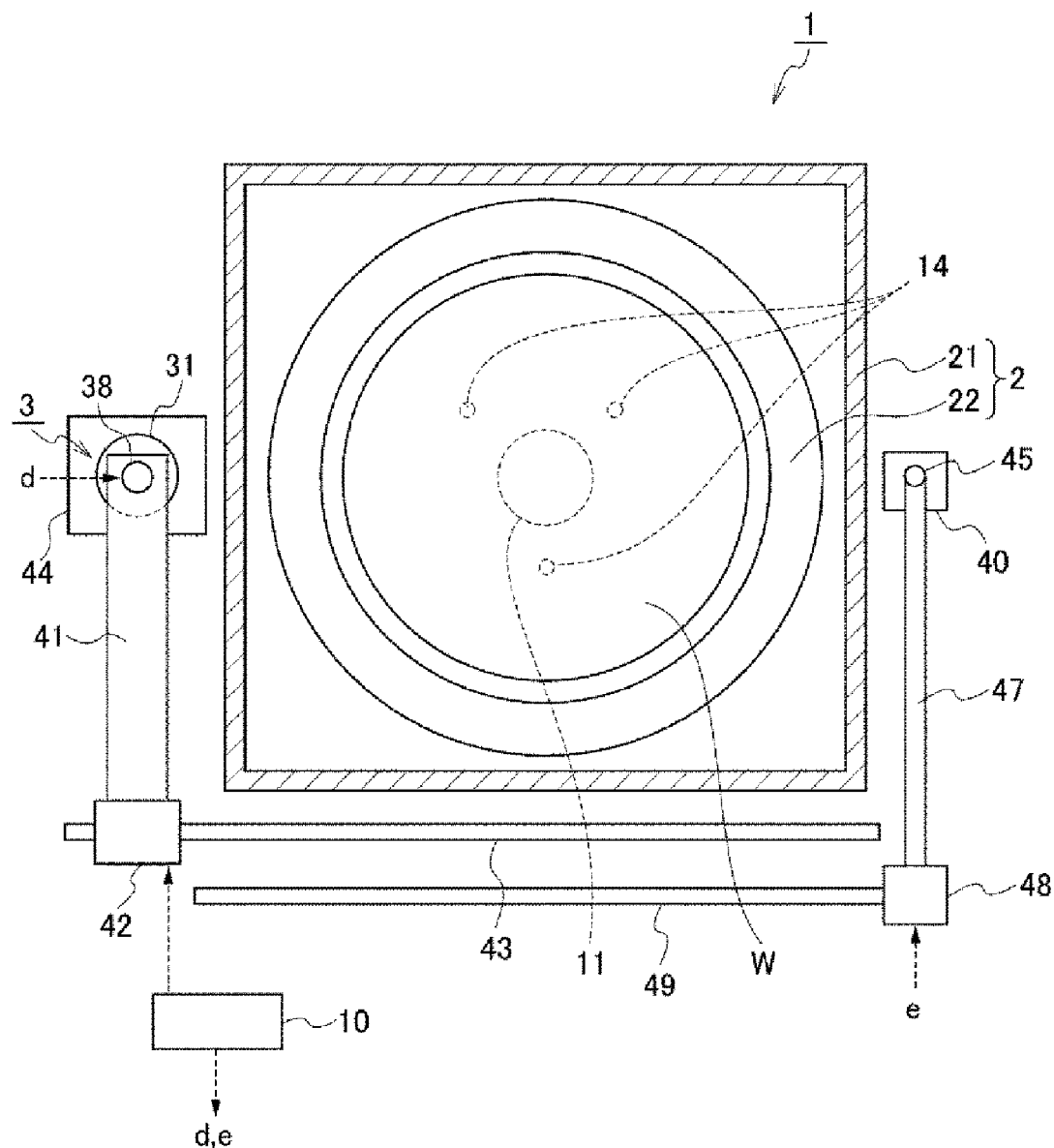
FIG. 2 is a plan view of the developing apparatus.

Referring to FIG. 1 to FIG. 5, a configuration of a developing apparatus 1 according to a first exemplary embodiment will be described. A wafer W having a resist film, which is formed on a surface of the wafer W and exposed to light according to a preset pattern, is carried into to be processed in the developing apparatus 1. As depicted in FIG. 1 and FIG. 2, the developing apparatus 1 includes a spin chuck 11 as a substrate holding unit, and the spin chuck 11 is configured to support a central portion of a rear surface of the wafer W and hold the wafer W horizontally. Further, the spin chuck 11 is connected via a rotation shaft 12 to a rotation driving unit 13 which is provided under the spin chuck 11. The spin chuck 11, the rotation shaft 12 and the rotation driving unit 13 correspond to a substrate rotating unit configured to rotate the wafer W about a vertical axis.

A recovery cup body 2 is provided in the developing apparatus 1 to surround the wafer W held on the spin chuck 11. The recovery cup body 2 includes an outer cup 21 and an inner cup 22, and the top of the recovery cup body 2 is opened. The outer cup 21 has a rectangular upper portion and a cylindrical lower portion. A step-shaped portion 23 is provided at the lower portion of the outer cup 21, and an elevating unit 24 configured to move the outer cup 21 up and down is connected to the step-shaped portion 23. The inner cup 22 has a cylindrical shape, and an upper portion of the inner cup 22 is inclined inwardly. By moving the outer cup 21 upwards, a lower end surface of the inner cup 22 comes into contact with the step-shaped portion 23, so that the inner cup 22 is lifted upwards accordingly. Thus, when removing a developing solution from the wafer W, the developing solution dispersed from the wafer W can be collected by raising the recovery cup body 2 (the outer cup 21 and the inner cup 22) as shown by dashed lines in FIG. 1.

A circular plate 25 is provided under the wafer W held on the spin chuck 11, and a ring-shaped guide member 26 having an inverted V-shaped longitudinal cross section is provided at an outside of the circular plate 25. The guide member 26 guides a developing solution or a cleaning solution, which is overflown to fall down from the wafer W, into a liquid sump 27 which is an annular recess portion provided at the outside of the circular plate 25. A liquid drain line 28 for exhausting or draining a gas or a liquid within the liquid sump 27 is connected to a bottom surface of the liquid sump 27, and a gas-liquid separation is performed through a gas-liquid separator (not shown) provided downstream of the liquid drain line 28. The drained liquid after the gas-liquid separation is collected into a non-illustrated drain tank.

Pins 14 connected to an elevating device 15 are provided under the wafer W held on the spin chuck 11. The pins 14 are moved up and down between a position above and a position below a wafer holding surface where the wafer W is held on the spin chuck 11, so that the wafer W is transferred between a non-illustrated substrate transfer device and the spin chuck 11.

The developing apparatus 1 includes a pad nozzle 31 configured to form a liquid puddle 30, which is a liquid film (developing solution film) (refer to FIG. 6 to FIG. 8 and FIG. 10 to be described later), by supplying a developing solution; and a cleaning liquid nozzle 45 configured to supply pure water as a cleaning liquid to the wafer W after the developing process. As illustrated in FIG. 2, the pad nozzle 31 is provided at a tip end of an arm 41, and a base end of the arm 41 is connected to a nozzle driving unit 42. The nozzle driving unit 42 is configured to move the arm 41 up and down and to be moved along a horizontally extended guide rail 43. As a result, the nozzle driving unit 42 can move the pad nozzle 31 along a radial direction of the wafer W held on the spin chuck 11. Further, a standby region 44, which is allowed to be engaged with a tip end portion of the pad nozzle 31 and implemented by a nozzle bus having a drain opening, is provided at an outside of the recovery cup body 2.

The cleaning liquid nozzle 45 is provided at a tip end of an arm 47, and a base end of the cleaning liquid nozzle 45 is connected to a nozzle driving unit 48. The nozzle driving unit 48 is configured to move the arm 47 up and down and to be moved along a horizontally extended guide rail 49. As a result, the cleaning liquid nozzle 45 can be moved by the nozzle driving unit 48 between a position above the wafer W held on the spin chuck 11 and a standby region 40 provided at an outside of the recovery cup body 2 and implemented by a nozzle bus.

Further, as depicted in FIG. 1, the cleaning liquid nozzle 45 is connected to a cleaning liquid supply source 46 including a pump, a valve, or the like.

In the developing apparatus 1 having the above-described configuration, the pad nozzle 41 has a function of suppressing the reactivity of the developing solution from being deteriorated due to components dissolved from a resist film. Below, referring to FIG. 3 to FIG. 5, a configuration of a nozzle head unit 3 equipped with the pad nozzle 31 will be explained.

Figure 3:
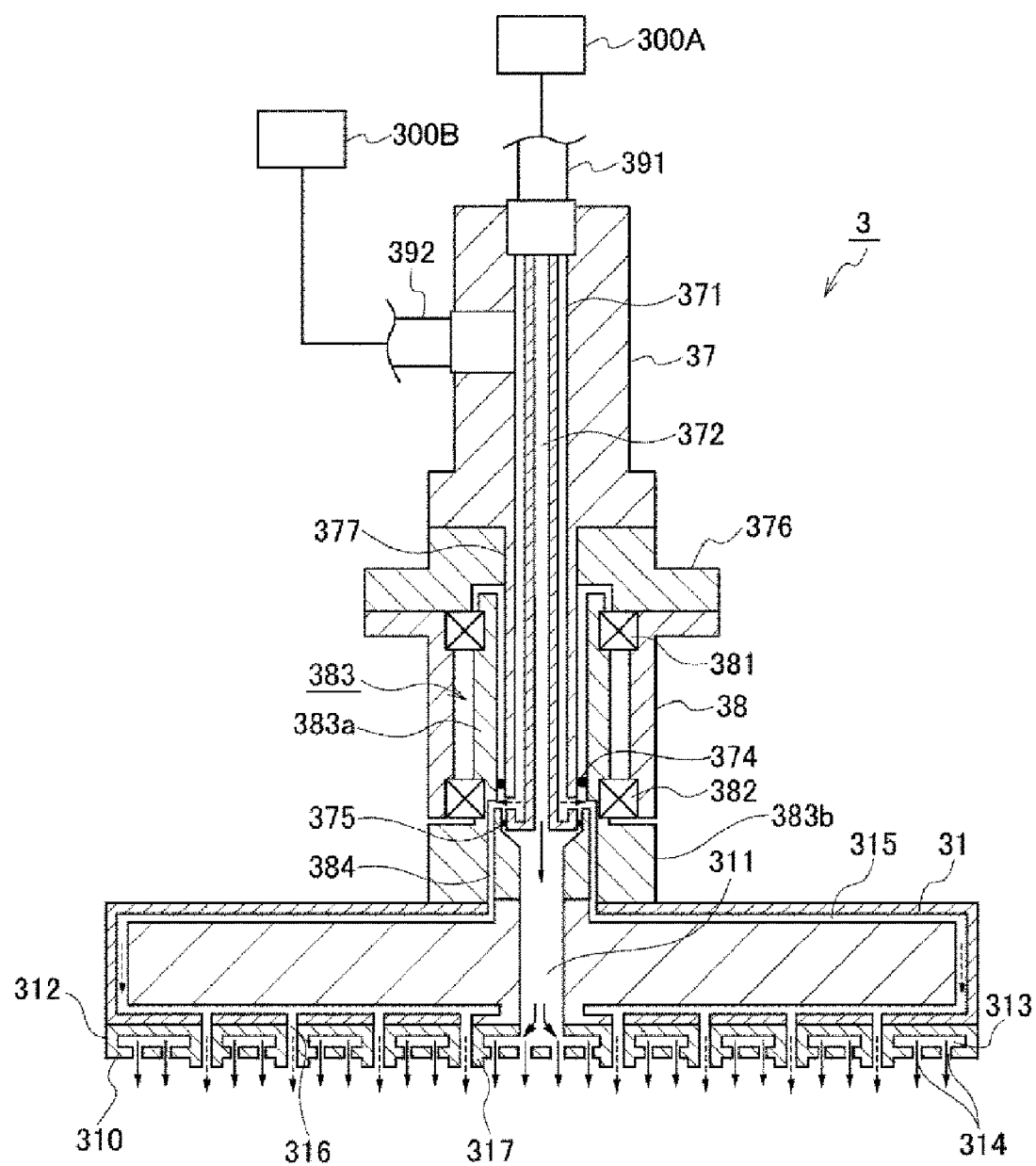
FIG. 3 is a longitudinal side view of a nozzle head unit provided in the developing apparatus.

As shown in FIG. 3, the nozzle head unit 3 includes the pad nozzle 31; a nozzle rotating device 38 configured to rotate the pad nozzle 31 about a vertical axis; and a manifold unit 37 provided with a flow path through which the developing solution supplied to the pad nozzle 31 is flown. The pad nozzle 31 is disposed to face the wafer W held on the spin chuck 11 and has a developing solution supplying surface 310 which is provided with a multiple number of developing solution discharge holes 314.

The pad nozzle 31 has a structure in which a developing solution supplying plate 312, which has a space 313 therein, is provided on a bottom surface of a circular plate-shaped member having a size smaller than a diameter (e.g., 300 mm) of the wafer W. The multiple number of developing solution discharge holes 314 are formed through a bottom surface of the developing solution supplying plate 312. The developing solution introduced into the space 313 through a developing solution supply path 311 formed in a central portion of the pad nozzle 31 is uniformly supplied toward a space below the developing solution supplying surface 310 through the developing solution discharge holes 314.

Further, provided along a top surface, a side surface and a bottom surface of the pad nozzle 31 is a nitrogen gas flow path 315 for supplying a gas (e.g., a nitrogen gas in the present embodiment) that pushes out the developing solution, whose reactivity is lowered, contained in the liquid puddle 30 of the developing solution supplied from the developing solution supplying surface 310. The nitrogen gas flow path 315 at the bottom surface side of the pad nozzle 31 penetrates through the space 313 of the developing solution supplying plate 312 and communicates with nitrogen gas discharge holes 316 opened at the developing solution supplying surface 310.

The nitrogen gas discharge holes 316 are opened in a bottom surface of a protrusion member 317 which is protruded downwards to be lower than the bottom of the developing solution supplying surface 310 at which the developing solution discharge holes 314 are opened. The protrusion member 317 divides the area where the developing solution discharge holes 314 are formed into plural areas along a circumferential direction of the developing solution supplying surface 310.

Figure 4:
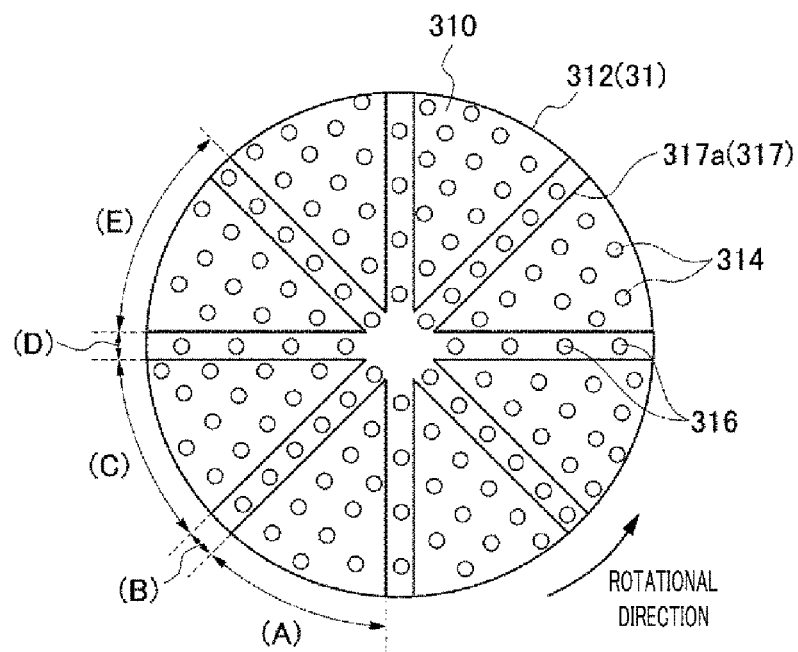
FIG. 4 is a plan view illustrating an example of a developing solution supplying surface of a pad nozzle provided in the nozzle head unit.
Figure 5:
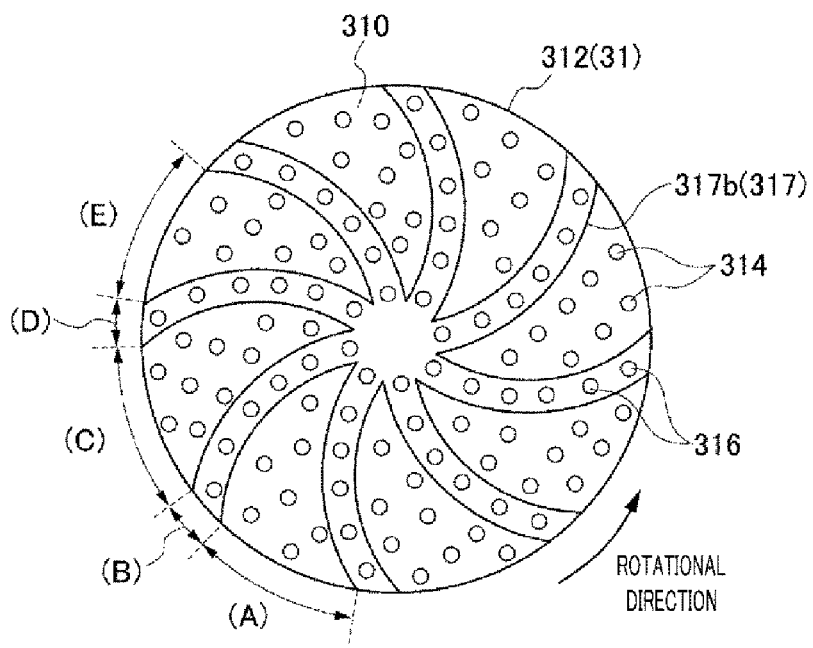
FIG. 5 is a plan view illustrating another example of the developing solution supplying surface.

For example, as illustrated in FIG. 4, a protrusion member 317a may be extended radially from a center of the circular developing solution supplying surface 310 in a straight line shape. In this case, the area where the developing solution discharge holes 314 are formed is divided into fan shapes along the circumferential direction of the developing solution supplying surface 310. Alternatively, as shown in FIG. 5, a protrusion member 317b may be extended spirally from the center of the developing solution supplying surface 310 in a curved line shape. In this case, the area where the developing solution discharge holes 314 are formed is divided into gently curved fan shapes along the circumferential direction of the developing solution supplying surface 310. Further, for the convenience of illustration, FIG. 4 and FIG. 5 show the arrangement of the protrusion members 317a and 317b seen through the developing solution supplying surface 310 when the pad nozzle 31 is viewed from the top.

Further, a cylindrical rotary drum 383 is connected to a central portion of a top surface of the pad nozzle 31. The rotary drum 383 includes a lower rotary drum 383b connected to the pad nozzle 31; and an upper rotary drum 383a having a smaller diameter and a larger height than those of the lower rotary drum 383b. The lower rotary drum 383b and the upper rotary drum 383a are coaxially connected. The inside of the rotary drum 383 is formed as a space, and this space communicates with the developing solution supply path 311 of the pad nozzle 31. Further, a nitrogen gas flow path 384 communicating with the nitrogen gas flow path 315 of the pad nozzle 31 is formed within a cylindrical wall of the lower rotary drum 383b. An upstream end of the nitrogen gas flow path 384 is opened toward the space of the rotary drum 383.

The nozzle rotating device 38 includes a non-illustrated electric motor and is configured to rotate the pad nozzle 31 connected to the rotary drum 383 around a vertical axis by using the rotary drum 383 as a rotor. The upper rotary drum 383a of the rotary drum 383 is embedded in the nozzle rotating device 38 and kept rotatable about the vertical axis by bearings 381 and 382.

The nozzle rotating device 38 or the rotary drum 383 corresponds to a nozzle rotating unit of the present exemplary embodiment.

The manifold unit 37 is connected to the nozzle rotating device 38 via a flange member 376. The inside of the manifold unit 37 has a dual pipe structure including an inner flow path 372 through which the developing solution flows and an outer flow path 371 through which the nitrogen gas flows. These flow paths 372 and 371 constituting a dual pipe unit 377 is protruded downwards from a bottom side of the manifold unit 37, and the dual pipe unit 377 is inserted in the space of the rotary drum 383 held by the nozzle rotating device 38.

The inner flow path 372 is opened at a lower end portion of the dual pipe unit 377 to communicate with the developing solution supply path 311 of the pad nozzle 31 through the space of the rotary drum 383. Meanwhile, the outer flow path 371 is opened at a lower side surface of the dual pipe unit 377 to supply the nitrogen gas toward a facing position to the opening of the nitrogen gas flow path 384 which is formed in the lower rotary drum 383b. A gap between an inner surface of the rotary drum 383 and an outer surface of the dual pipe unit 377 is partitioned by sealing members 374 and 375, so that the developing solution supplied from the inner flow path 372 and the nitrogen gas supplied from the outer flow path 371 are not mixed. Further, on the inner surface of the rotary drum 383, an area where the developing solution flows and an area where the nitrogen gas flows are divided in a slidably movable manner via sliding surfaces of the sealing members 374 and 375.

An upstream end of inner flow path 372 formed in the manifold unit 37 is connected via a developing solution supply path 391 to a developing solution supply source 300A including a pump, a valve, or the like. Further, an upstream end of the outer flow path 371 is connected to a nitrogen gas supply source 300B via a nitrogen gas supply path 392.

In the developing apparatus 1 according to the present exemplary embodiment, the nozzle driving unit 42, the substrate rotating unit composed of the spin chuck 11 or the like and the nozzle rotating unit composed of the nozzle rotating device 38 or the like constitute a moving device that moves the wafer W and the nozzle head unit 3 relatively to each other.

The developing apparatus 1 includes a controller 10 which is implemented by a computer. The controller 10 includes a non-illustrated program storage unit. The program storage unit stores therein a program including processing steps created to implement a developing process to be described later. The controller 10 outputs control signals to the individual components of the developing apparatus 1 based on this program to control a movement of the pad nozzle 31 by the nozzle driving unit 42, a movement of the cleaning liquid nozzle 45 by the nozzle driving unit 48, a rotation of the pad nozzle 31 by the nozzle rotating device 38, a supply of the developing solution into the pad nozzle 31 from the developing solution supply source 300A, a supply of the cleaning liquid into the cleaning liquid nozzle 45 from the cleaning liquid supply source 46, a supply of the nitrogen gas into the pad nozzle 31 from the nitrogen gas supply source 300B, a rotation of the wafer W by the spin chuck 11, an elevation of the pins 14, and so forth. The program storage unit may be implemented by a recording medium such as, but not limited to, a hard disk, a compact disk, a magnetic optical disk or a memory card.

Here, examples of various kinds of design parameters regarding the pad nozzle 31 provided in the above-described developing apparatus 1 are as follows. A horizontal moving speed of the pad nozzle 31 that is moved above the wafer W held on the spin chuck 11 is set to be in the range from, e.g., 10 mm/s to 100 mm/s. Further, a diameter of the developing solution supplying surface 310 is in the range from, e.g., 50 mm to 200 mm. A rotational speed (i.e., number of revolutions per a unit time) of the wafer W is set to be, desirably, equal to or less than 100 rpm and, more desirably, in the range from 10 rpm to 50 rpm, to suppress the developing solution from being splashed when the developing solution is discharged onto the wafer W. Further, a rotational speed of the pad nozzle 31 is adjusted within the range from, e.g., 50 rpm to 1000 rpm.

Now, referring to FIG. 6 to FIG. 10, a sequence of a developing process and a cleaning process performed by using the above-described developing apparatus 1 will be explained. FIG. 9 is a time chart of the developing process, and this time chart shows a relationship between an elapsed time (processing time) after the beginning of the developing process and rotational speeds of the pad nozzle 31 and the wafer W. A solid-line graph indicates a rotational speed of the pad nozzle 31 (marked as "Case 1") and a dashed-dotted-line graph represents a rotational speed of the wafer W. Further, on this time chart, time periods during which the developing solution and the nitrogen gas are discharged from the pad nozzle 31 and a time period during which the pad nozzle 31 is moved while the developing solution is discharged are also indicated by band charts.

First, a wafer W is carried into the developing apparatus 1 by a non-illustrated substrate transfer device. If the wafer W is held on the spin chuck 11, the pad nozzle 31 is moved from the standby region 44 to a position above a central portion of the wafer W. Then, as schematically illustrated in FIG. 10, the pad nozzle 31 is moved down to locate the developing solution supplying surface 310 several millimeters (mm) above a top surface of the wafer W. Thereafter, a developing solution is supplied onto the wafer W from the pad nozzle 31 and the pad nozzle 31 is rotated counterclockwise when viewed from the top (time t1 in FIG. 9). Accordingly, a liquid puddle 30 larger than the developing solution supplying surface 310 is formed between the developing solution supplying surface 310 of the pad nozzle 31 and the wafer W such that it is in contact with the developing solution supplying surface 310.

Figure 6:
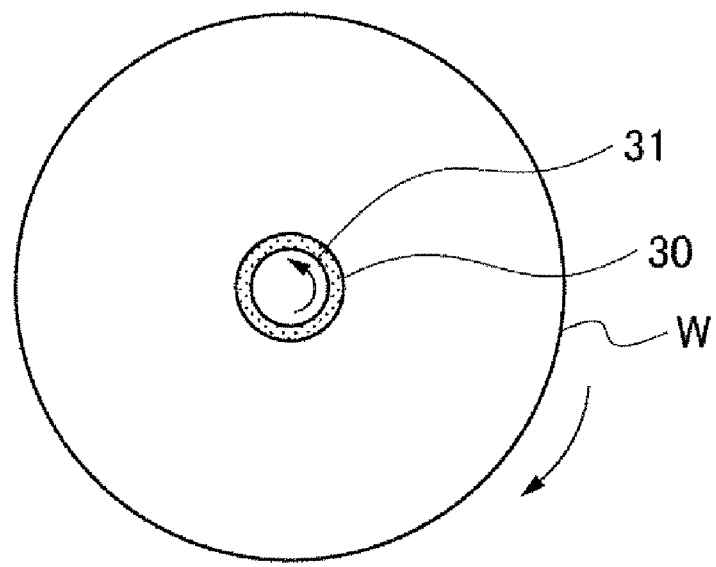
FIG. 6 is a first explanatory diagram for describing a developing process performed by the developing apparatus.
Figure 7:
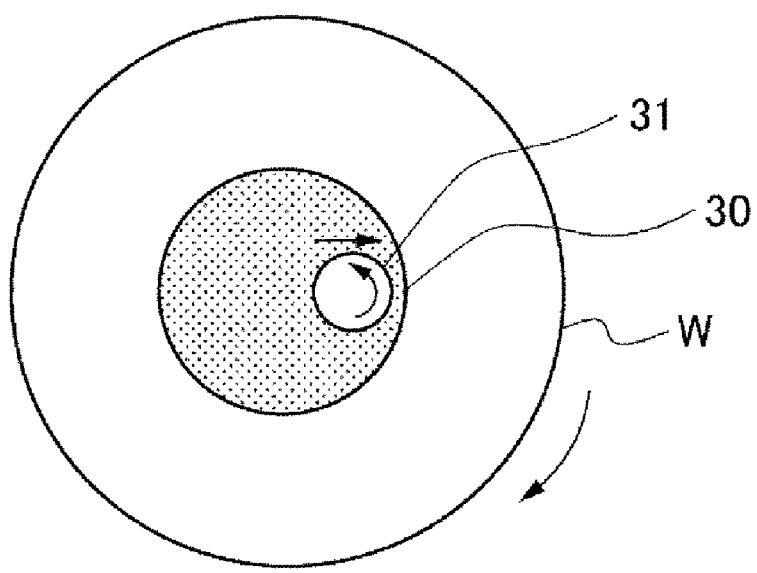
FIG. 7 is a second explanatory diagram for describing the developing process.

If the pad nozzle 31 is rotated at a preset rotational speed, that preset rotational speed is maintained, and, then, the wafer W is rotated clockwise when viewed from the top (FIG. 6). If the rotational speed of the wafer W reaches, e.g., 10 rpm, the pad nozzle 31 is started to be moved at a moving speed of, e.g., 10 mm/s from the central portion (marked as "C" on the band chart indicating the pad nozzle moving period in FIG. 9) of the wafer W toward a periphery (marked as "E" on the same band chart) thereof (time t2 in FIG. 9). Accordingly, the liquid puddle 30 is diffused toward the periphery of the wafer W while being in contact with the developing solution supplying surface 310 of the pad nozzle 31 (FIG. 7).

When the liquid puddle 30 is diffused, since the pad nozzle 31 is being rotated, the developing solution within the liquid puddle 30 is agitated and a concentration of the developing solution containing therein components dissolved from a resist film is uniformed. As a result, CD (Critical Dimension) uniformity of a pattern developed from the resist film after being exposed to light can be improved. Further, the rotational direction of the pad nozzle 31 is not limited to the counterclockwise direction when viewed from the top, but the pad nozzle 31 may be rotated in the clockwise direction, the same as the wafer W. As shown in FIG. 7, however, by rotating the wafer W and the pad nozzle 31 in opposite directions from each other, an effect of increasing the power for agitating the developing solution and improving the uniformity of the concentration of the developing solution can be achieved.

At time t3 upon the lapse of a preset time, e.g., 1 sec to 2 sec after the movement of the pad nozzle 31 is begun, a supply of the nitrogen gas from the nitrogen gas discharge holes 316 is started while continuously rotating the pad nozzle 31. As explained above with reference to FIG. 4 and FIG. 5, the area where the developing solution discharge holes 314 are formed is divided along the circumferential direction of the developing solution supplying surface 310 by the protrusion member 317. FIG. 10 schematically provides an enlarged view of the liquid puddle 30 formed under areas where the developing solution discharge holes 314 are formed and areas (protrusion member 317) where the nitrogen gas discharge holes 316 are formed. As stated above, the pad nozzle 31 and the wafer W are rotated independently. In FIG. 10, the relative moving directions of the pad nozzle 31 and the wafer W are indicated by arrows.

Here, in FIG. 4 and FIG. 5, areas where the developing solution discharge holes 314 are formed and areas (protrusion member 317) where the nitrogen gas discharge holes 316 are formed, which are arranged alternately, are assigned notations (A) to (E) along the rotational direction of the pad nozzle 31, respectively. Here, it is assumed that the schematic diagram of FIG. 10 shows the liquid puddle 30 formed under these areas (A) to (E). The liquid puddle 30 of the developing solution that fills a gap between the developing solution supplying surface 310 and the wafer W is formed in the areas (A), (C) and (E) where the developing solution discharge holes 314 are formed. Meanwhile, under each area where the nitrogen gas discharge holes 316 are formed, the developing solution is pushed out by the nitrogen gas discharged downwards from the nitrogen gas discharge holes 316, so that a gas-phase portion 301 is caused to form a thin film portion 302 in which a developing solution film forming the liquid puddle 30 is thinned.

Here, a point (a) on the wafer W shown in FIG. 10, for example, is noted in consideration of the relative moving directions of the pad nozzle 31 and the wafer W. The liquid puddle 30 and the thin film portion 302 pass the point (a) alternately in the order of liquid puddle 30 of the area (A)→thin film portion 302 of the area (B)→liquid puddle 30 of the area (C)→thin film portion 302 of the area (D)→liquid puddle 30 of the area (E).

Further, as stated above, since the pad nozzle 31 is moved from the central portion of the wafer W toward the periphery thereof while being rotated and the wafer W itself is also rotated about the vertical axis, the number of times that the liquid puddle 30 and the thin film portion 302 pass the point (a) alternately may vary depending on the moving speed of the pad nozzle 31 or the rotational speed of the wafer W.

Now, the developing process in the case where the area provided with the developing solution discharge holes 314 and the area provided with the nitrogen gas discharge holes 316 pass alternately will be explained. By way of example, if the point (a) on the wafer W comes into contact with the liquid puddle 30 of the developing solution supplied from the developing solution discharge holes 314 in the area (A), a part of a resist film is dissolved in the developing solution according to an exposed pattern. The dissolution of the resist film accompanies a decrease of the reactivity of the developing solution.

If the nitrogen gas discharge holes 316 of the area (B) are moved to where the reactivity of the developing solution has been reduced, the developing solution containing the components dissolved from the resist film is pushed out by the nitrogen gas discharged from the nitrogen gas discharge holes 316, so that the thin film portion 302 is formed. The pushed developing solution flows along a direction in which the protrusion member 317 is extended to be discharged to a region outside the gas-phase portion 301.

If the area (C) reaches where the thin film portion 302 is formed and a new developing solution is supplied from the developing solution discharge holes 314, a ratio of the developing solution containing the components dissolved from the resist film decreases, and a developing process at the point (a) is performed with the new developing solution having high reactivity.

As stated above, by alternately supplying the new developing solution and pushing out the developing solution having the reduced reactivity, the time-average reactivity of the developing solution in contact with the point (a) can be maintained high, and, thus, a time period required for the completion of the developing process can be shortened. As a result, even in case of developing the thick-film resist having low sensitivity or the resist film for EUV, it is possible to suppress a time period required for the developing process from being increased.

In the above, the nitrogen gas discharge holes 316 correspond to a pushing mechanism configured to thin the liquid puddle 30 (developing solution film) by pushing it out. Further, with respect to protrusion member 317 provided with the nitrogen gas discharge holes 316, the area with the developing solution discharge holes 314 located at the front side in the relative moving direction of the pad nozzle 31 with respect to the wafer W corresponds to a first developing solution supply unit, whereas the area with the developing solution discharge holes 314 located at the rear side in this relative moving direction corresponds to a second developing solution supply unit. That is, in the relationship between the areas (A) and (C), the area (A) serves as the first developing solution supply unit and the area (C) serves as the second developing solution supply unit. Further, in the relationship between the areas (C) and (E), the area (C) serves as the first developing solution supply unit and the area (E) serves as the second developing solution supply unit.

Furthermore, a gas used for pushing out the liquid puddle 30 is not limited to the aforementioned nitrogen gas. That is, any gas, such as an argon gas, having low reactivity with the developing solution or the resist film may be used. Here, if there is little influence upon the developing solution or the resist film, clean air can also be used.

The pad nozzle 31 is continuously moved on the wafer W while being rotated, such that the pad nozzle 31 does not overtake the liquid puddle 30 which is being diffused. Here, it is avoided for the pas nozzle 31 to overtake the liquid puddle 30 for the following reason. If the pad nozzle 31 overtakes the liquid puddle 30, the flow of the developing solution may be cut, and plural liquid puddles 30 may be diffused onto the surface of the wafer W individually. If interfaces of the individually diffused liquid puddles 30 are joined, a CD of a resist pattern at this position may be differed from a CD of the resist pattern at other positions. As a result, a CDU (Critical Dimension Uniformity) indicating uniformity of the resist pattern on the entire surface of the wafer may be degraded. To avoid these problems, the moving speed of the pad nozzle 31 is set such that the pad nozzle 31 does not overtake the liquid puddle 30.

Figure 8:
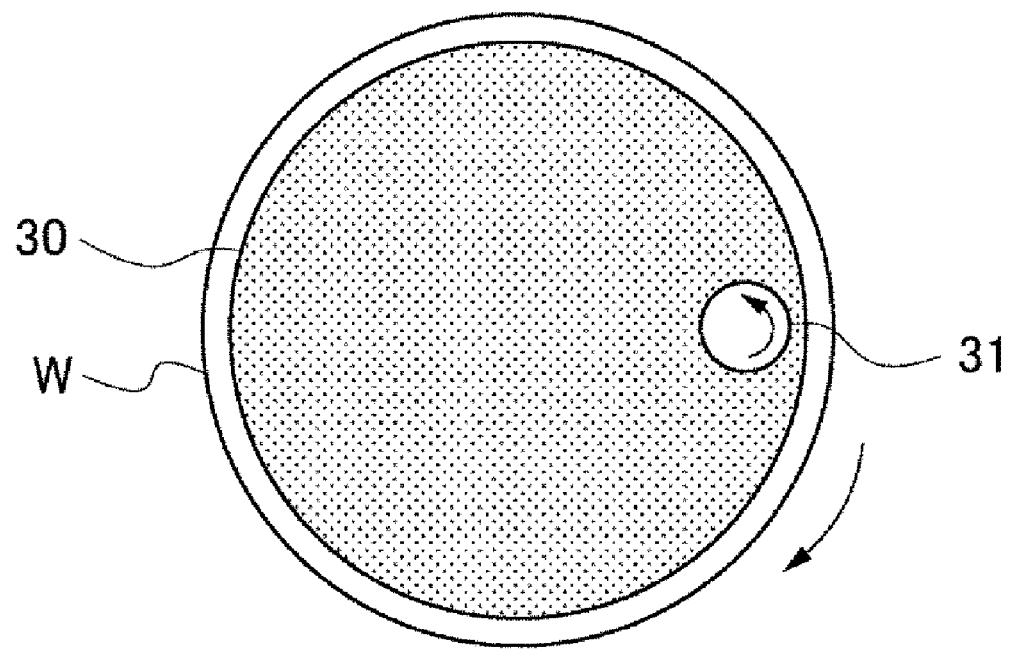
FIG. 8 is a third explanatory diagram for describing the developing process.
Figure 9:
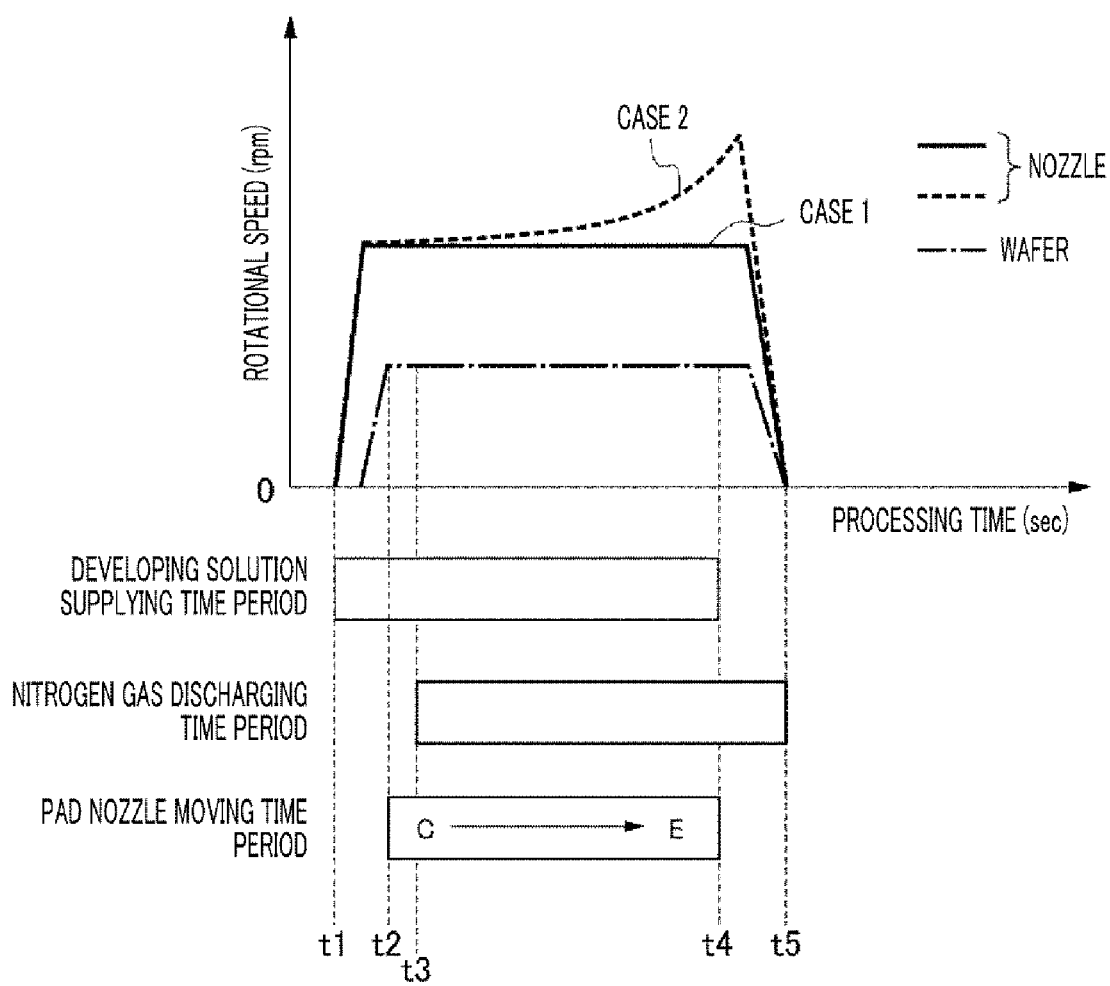
FIG. 9 is a time chart of the developing process.
Figure 10:
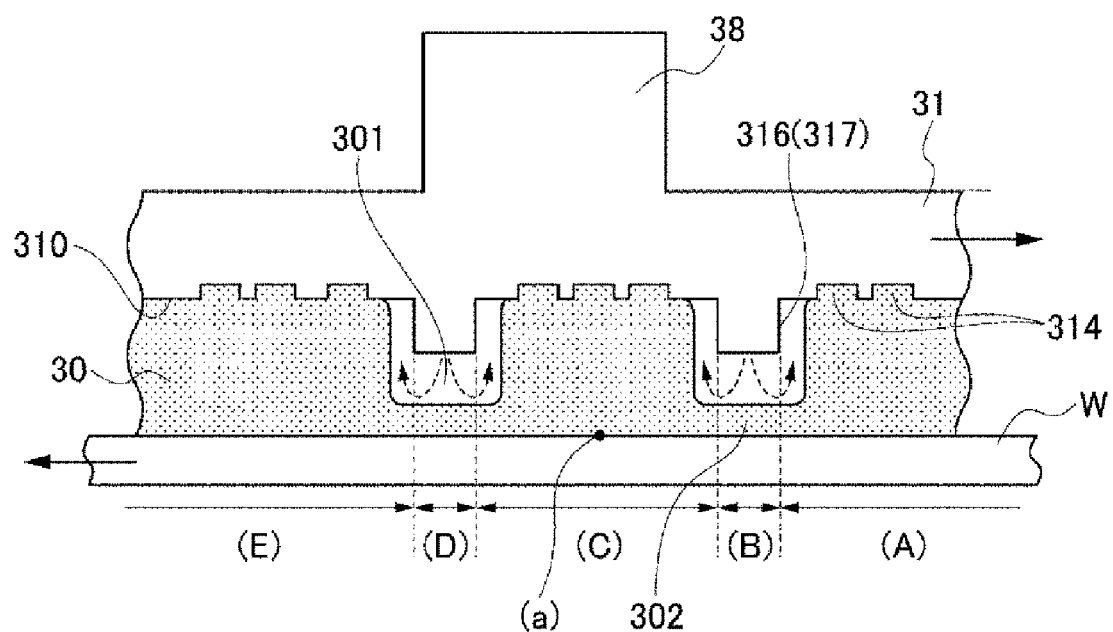
FIG. 10 is a schematic diagram illustrating an operation of the pad nozzle.

If the pad nozzle 31 is moved up to the periphery of the wafer W and the entire surface of the wafer W is covered with the liquid puddle 30 of the developing solution, the movement of the pad nozzle 31 and the supply of the developing solution are stopped (FIG. 8 and time t4 in FIG. 9). Here, the entire surface of the wafer W refers to an entire area where the resist pattern is formed. For example, on the wafer W in which such resist-patterned area is not formed at a periphery portion thereof, the liquid puddle 30 need not be formed on that periphery portion. FIG. 8 illustrates an example where the liquid puddle 30 is formed up to a position slightly inside an edge of the wafer W. However, the liquid puddle 30 may be formed to cover the whole area of the wafer W including the edge thereof.

The developing solution is agitated by continuously rotating the pad nozzle 31 until the entire surface of the wafer W is covered with the liquid puddle 30. After the movement of the pad nozzle 31 and the supply of the developing solution are stopped, the rotations of the pad nozzle 31 and the wafer W are stopped, and the supply of the nitrogen gas from the nitrogen gas discharge holes 316 is also stopped (time t5 in FIG. 9). Thereafter, the pad nozzle 31 is lifted and moved to the standby region 44.

The surface of the wafer W after the pad nozzle 31 is retreated is covered with the stationary liquid puddle 30, and a reaction between the resist film and the developing solution further progresses on the entire surface of the wafer W (not shown). If a preset time elapses, the cleaning liquid nozzle 45 is moved to a position above the central portion of the wafer W, and the wafer W is rotated at a preset rotational speed. Then, a cleaning liquid is supplied onto the wafer W from the cleaning liquid nozzle 45. The cleaning liquid is diffused onto the entire surface of the wafer W by a centrifugal force applied to the cleaning liquid, so that the liquid puddle 30 of the developing solution is removed from the wafer W (not shown). Subsequently, the discharge of the cleaning liquid from the cleaning liquid nozzle 45 is stopped. By continuously rotating the wafer W, the cleaning liquid is dispersed and the wafer W is dried. Afterwards, the wafer W is taken out of the developing apparatus 1 by the non-illustrated substrate transfer device.

The developing apparatus 1 according the present exemplary embodiment have the following effects. The nitrogen gas is discharged from the nitrogen gas discharge holes 316 onto the liquid puddle 30 (developing solution film) of the developing solution which is supplied on the surface of the wafer W having thereon the resist film exposed to light. Accordingly, the developing solution in the liquid puddle 30 is pushed out, and the thin film portion 302 is formed. Then, by supplying the new developing solution onto the area where the thin film portion 302 is formed, a developing solution film having high reactivity is formed instead of the developing solution which has the reduced reactivity and contains the components dissolved from the resist film. Thus, an efficient developing process can be performed on the time average.

Here, there is no limitation that the rotational speed of the pad nozzle 31 should be maintained constant when the pad nozzle 31 is moved from the central portion of the wafer W toward the periphery thereof, as illustrated in Case 1 in FIG. 9. For example, as indicated as "Case 2" by a dashed line in FIG. 9, the rotational speed of the pad nozzle 31 may be gradually increased as it is moved from the central portion of the wafer W toward the periphery thereof. As in the example described with reference to FIG. 6 to FIG. 8, when diffusing the liquid puddle 30 from the central portion of the wafer W toward the periphery thereof, a contact time between the surface of the wafer W and the developing solution decreases as it goes toward the periphery of the wafer W.

Accordingly, in Case 2 of FIG. 9, by increasing the rotational speed of the pad nozzle 31 as the pad nozzle 31 approaches the periphery of the wafer W, the developing solution is further agitated, and, by increasing the number of alternatively forming the liquid puddle 30 and the thin film portion 302 on the surface of the wafer W, the reactivity of the developing solution and the resist can be improved. As stated above, by controlling the rotational speed of the pad nozzle 31, the CD uniformity over the entire surface of the wafer W can be further improved while increasing the efficiency of the developing process as well.

In the exemplary embodiment, however, it is not essential to rotate the pad nozzle 31 about the vertical axis. By way of example, even without rotating the pad nozzle 31, the liquid puddle 30 and the thin film portion 302 as described in FIG. 10 can be formed by moving the pad nozzle 31 having the developing solution discharge holes 314 or the nitrogen gas discharge holes 316 from the central portion of the wafer W toward the periphery thereof. As a result, there can also be achieved an operation and an effect of performing the developing process by supplying the new developing solution having high reactivity after pushing out the developing solution containing the dissolved components.

In the first exemplary embodiment, the wafer W is rotated to diffuse the liquid puddle 30 from the central portion of the wafer W toward the periphery thereof. However, the rotation of the wafer W may not be essential. By way of example, by setting a size of the developing solution supplying surface 310 of the pad nozzle 31 to be the same size as the wafer W or to be larger than that, the developing solution supplying surface 310 is positioned close to the wafer W. With this configuration, the pad nozzle 31 is rotated while supplying the developing solution and the nitrogen gas from the areas on the developing solution supplying surface 310 where the developing solution discharge holes 314 and the nitrogen gas discharge holes 316 are formed, respectively. At this time, the pad nozzle 31 is not moved horizontally. Through this operation, on a bottom surface of the developing solution supplying surface 310, the developing solution is agitated and the liquid puddle 30 is formed and diffused toward the central portion of the wafer W toward the periphery thereof. The liquid puddle 30 and the thin film portion 302 passes each point on the surface of the wafer W alternately. Therefore, in this example as well, there can be performed the developing process with high CD uniformity on the entire surface of the wafer W while improving the processing efficiency as well.

If, however, the pad nozzle 31 is rotated, a liquid flow may also be generated on a region slightly outside the developing solution supplying surface 31 along the liquid flow under the developing solution supplying surface 310. In view of this, in case of forming a rotational flow without rotating the wafer W and horizontally moving the pad nozzle 31 as stated above, the size of the developing solution supplying surface 310 of the pad nozzle 31 may be set to be slightly smaller than that of the wafer W.

Here, the substrate on which the above-described developing process is performed may not be limited to be the circular wafer W, and a substrate having a rectangular shape may also be employed. Further, though the liquid puddle 30 formed on the wafer W is limited to the developing solution in the above-described embodiment, it may be also possible to perform a cleaning process by accumulating a cleaning liquid on the wafer W by using the pad nozzle 31.

Further, the moving direction of the pad nozzle 31 may not be limited to being moved from the central portion of the wafer W toward the periphery thereof. To the contrary to the above-described embodiment, the pad nozzle 31 may be moved from the periphery of the wafer W toward the central portion thereof. In such a case, the liquid puddle 30 may be diffused from the periphery of the wafer W toward the central portion thereof. However, if the diffused developing solution join at the central portion of the wafer W and thus different interfaces come into contact with each other, the CD uniformity may be deteriorated, as mentioned above. Therefore, the configuration of moving the pad nozzle 31 from the periphery of the wafer W toward the central portion thereof may be employed in a developing process where high CD uniformity is not required.

Figure 11:
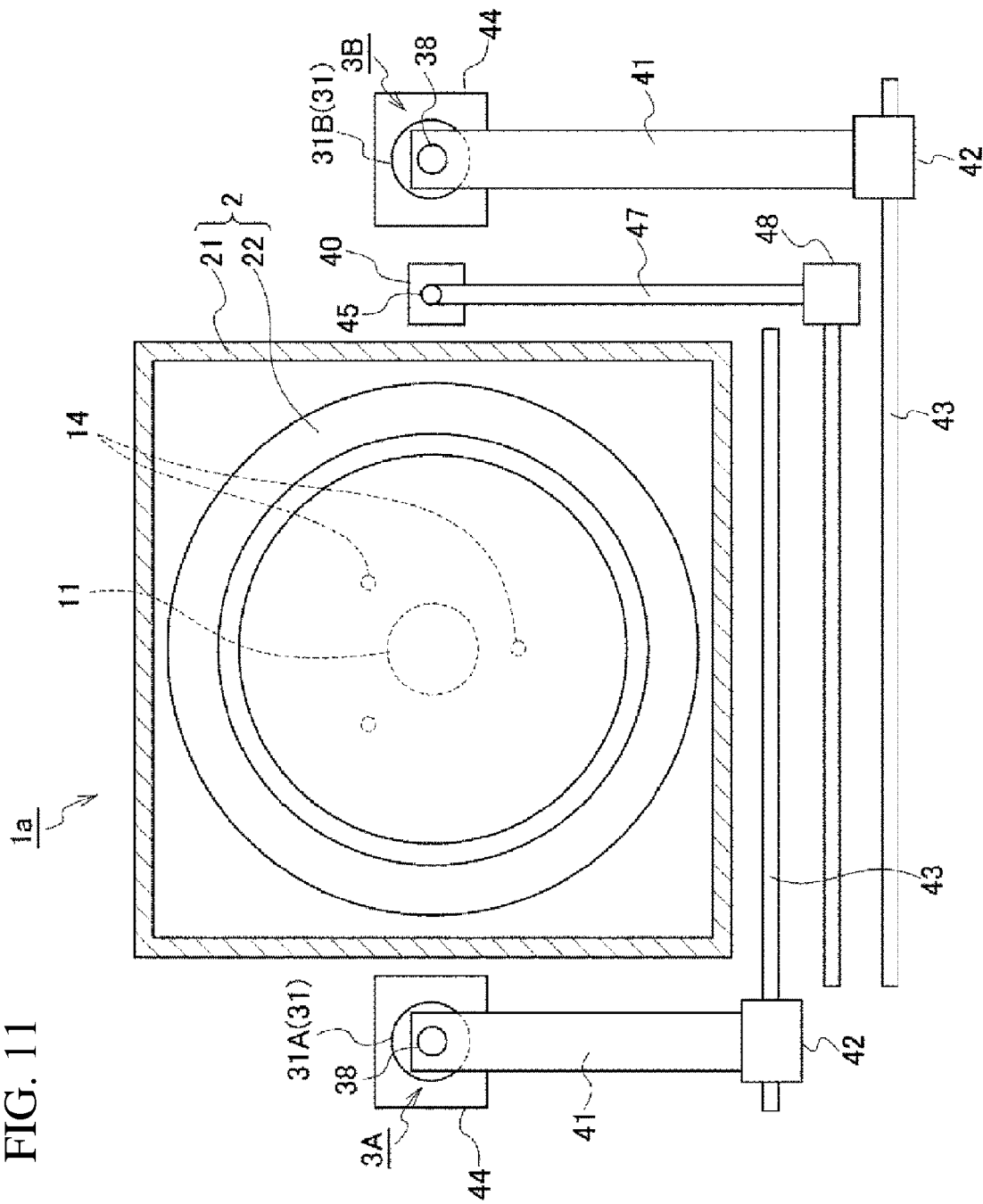
FIG. 11 is a plan view illustrating a modification example of the developing apparatus.

Referring to FIG. 11, there is illustrated a developing apparatus 1a having two sets of nozzle head units 3 (i.e., nozzle head units 3A and 3B) according to a modification example of the first exemplary embodiment. The nozzle head units 3A and 3B have the same structure as that of the nozzle head unit 3 shown in FIG. 3, and each of the nozzle head units 3A and 3B has a pad nozzle 31 (hereinafter, the pad nozzle of the nozzle head unit 3A may be occasionally referred to as a first pad nozzle 31A, and the pad nozzle of the nozzle head unit 3B, as a second pad nozzle 31B, for the purpose of distinction). Each of the nozzle head unit 3A and 3B is connected to the nozzle driving unit 42 via the arm 41, and is configured to be movable between a position above the wafer W held on the spin chuck 11 and the standby region 44, which is the same as that of the developing apparatus 1 shown in FIG. 2. With this configuration, a rotation of each pad nozzle 31, a discharge of a developing solution from each pad nozzle 31 and a moving operation of each pad nozzle 31 above the wafer W can be performed independently.

In respective exemplary embodiments to be described below with reference to FIG. 11 to FIG. 25, the same components as those described above with reference to FIG. 1 to FIG. 10 are assigned same reference numerals.

Figure 12:
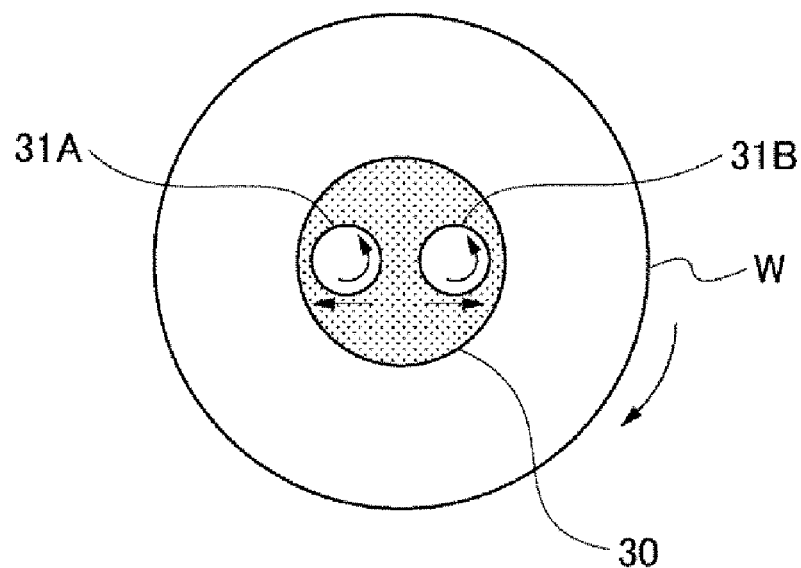
FIG. 12 is a first explanatory diagram for describing a developing process according to the modification example.
Figure 13:
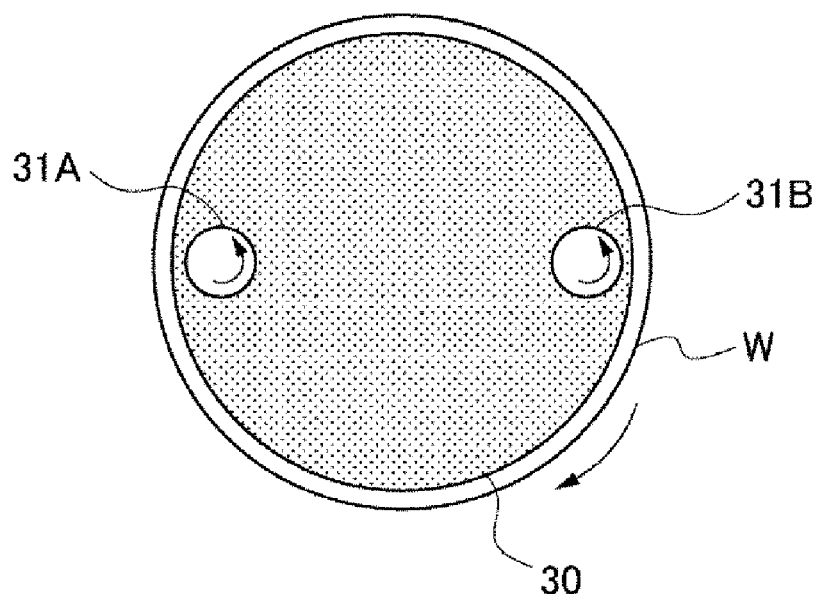
FIG. 13 is a second explanatory diagram for describing the developing process according to the modification example.
Figure 14:
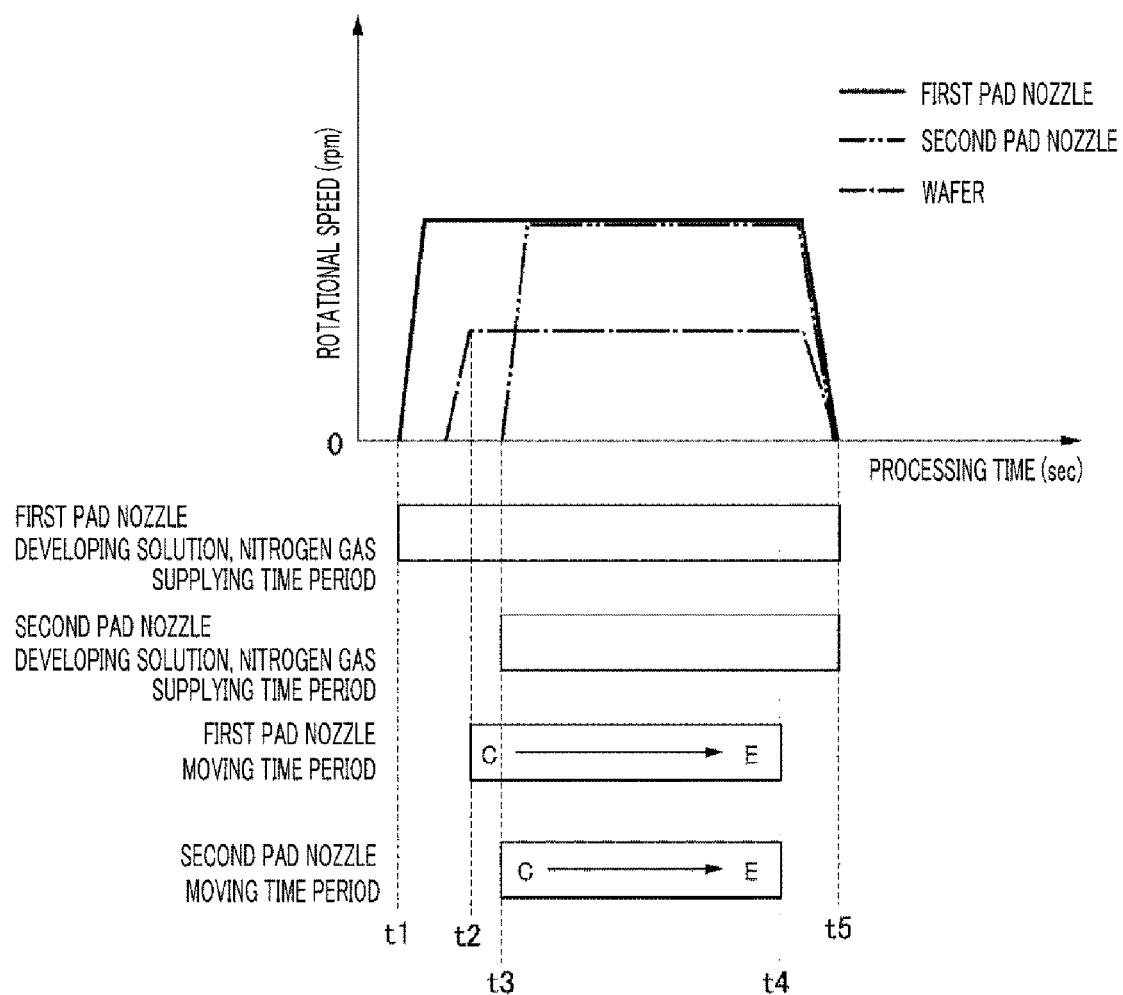
FIG. 14 is a time chart of the developing process according to the modification example.

Referring to FIG. 12 to FIG. 14, a developing process using the developing apparatus 1a will be explained. Here, a time chart of FIG. 14 is almost the same as that described in FIG. 9 excepting that supply timings of a developing solution and a nitrogen gas from the first pad nozzle 31A and the second pad nozzle 31B are further provided. Further, a variation in a rotational speed of the first pad nozzle 31A is indicated by a solid line, and a variation in a rotational speed of the second nozzle 31B is indicated by a dashed double-dotted line.

First, the first pad nozzle 31A is moved to a position above the central portion of the wafer W which is stopped, and then, is lowered down to a preset height position. Then, the developing solution is supplied from the first pad nozzle 31A onto the wafer W. Here, since an operation of rotating the first pad nozzle 31A in the counterclockwise direction when viewed from the top is the same as in the case of the pad nozzle 31 shown in FIG. 6, illustration thereof is omitted (time t1 in FIG. 14). Then, the wafer W is rotated, and if the wafer W rotates at a preset rotational speed, the first pad nozzle 31A is started to be moved toward the periphery of the wafer W, and the supply of the nitrogen gas from nitrogen gas discharge holes 316 is begun upon the lapse of a preset time after the first pad nozzle 31A is started to be moved (time t2 in FIG. 14).

Subsequently, while diffusing a liquid puddle 30 of the developing solution from the central portion of the wafer W toward the periphery thereof, the second pad nozzle 31B is located at a position where a distance between the first pad nozzle 31A and the central portion of the wafer W is substantially same as a distance between the second pad nozzle 31B and the central portion of the wafer W at a timing when the first pad nozzle 31A reaches a preset position, as depicted in FIG. 12. Further, as for the second pad nozzle 31B, the rotation of the second pad nozzle 31B, a supply of the developing solution from developing solution discharge holes 314, a supply of the nitrogen gas from nitrogen gas discharge holes 316 are started in sequence, and the second pad nozzle 31B is moved in the opposite direction from that of the first pad nozzle 31A (time t3 in FIG. 14).

The first and second pad nozzles 31A and 31B are moved from the central portion of the wafer W toward the periphery thereof, as stated above. If the pad nozzles 31A and 31B respectively reach the periphery of the wafer W and the liquid puddle 30 is formed on the entire surface of the wafer W, the movement of the pad nozzles 31A and 31B are stopped (FIG. 13 and time t4 in FIG. 14). Thereafter, the rotation of the pad nozzles 31A and 31B and the wafer W, and the supply of the developing solution and the nitrogen gas from the pad nozzles 31A and 31B are stopped (time t5 in FIG. 14).

After the discharge of the developing solution from the pad nozzles 31A and 31B is stopped, a reaction between the liquid puddle 30 and a resist film progresses in the same way as that described above with reference to FIG. 8. Then, after a lapse of a preset time, the developing solution is removed from the wafer W by rotating the wafer W and supplying the cleaning liquid.

While the two pad nozzles 31A and 31B are moved above the wafer W, the developing solution is discharged from the area of each developing solution supplying surface 310 where the developing solution discharge holes 314 are provided, and the nitrogen gas is discharged from the area where the nitrogen gas discharge holes 316 are formed. Accordingly, the liquid puddle 30 and the thin film portion 302 alternately pass the surface of the wafer W to be processed, so that an efficient developing process is performed, which is the same as stated above in the case of the developing apparatus 1 shown in FIG. 1 and FIG. 2.

In the developing apparatus 1a according to the present modification example using the two pad nozzles 31A and 31B, the developing process is performed on the central portion of the wafer W by using the first pad nozzle 31A, and after the first pad nozzle 31A is moved from the central portion of the wafer W to a preset position at the peripheral side of the wafer W, the developing process is performed by using the two pad nozzles 31A and 31B until they respectively reach the periphery of the wafer W. The developing process as described in FIG. 10 is repeatedly performed by the pad nozzles 31A and 31B, and the number of times the liquid puddle 30 and the thin film portion 302 alternately pass the surface of the wafer W is increased. Therefore, a uniform developing process can be performed with higher processing efficiency.

As a result, the processing time can be shortened, and the CD uniformity of the resist pattern on the entire surface of the wafer W can be more securely improved. Especially, with a scale-up of the wafer W, since the amount of the components dissolved in the liquid puddle 30 on the periphery of the wafer W having a large processing area becomes larger, there is a concern that the reactivity of the developing solution may be reduced. Thus, this method of performing the developing process by using the plural pad nozzles 31A and 31B may be advantageous.

Here, as depicted in Case 2 of FIG. 9, the rotational speeds of the two pad nozzles 31A and 31B may be controlled such that the rotational speed of either one of the pad nozzles 31A and 31B or the rotational speeds of both of the pad nozzles 31A and 31B is increased as they approach the periphery of the wafer W.

Second Exemplary Embodiment

A developing apparatus 1b according to a second exemplary embodiment to be described below with reference to FIG. 15 to FIG. 20 is different from the developing apparatus 1 of the first exemplary embodiment where the developing solution discharge holes 314 are formed in the developing solution supplying surface 310 of the pad nozzle 31, in that a slit nozzle unit 31C configured as the nozzle head unit including developing solution supply slits 318a and 318b, which serve as developing solution discharge holes of slit shapes, is fixed to the tip end portion of the arm 41.

Figure 15:
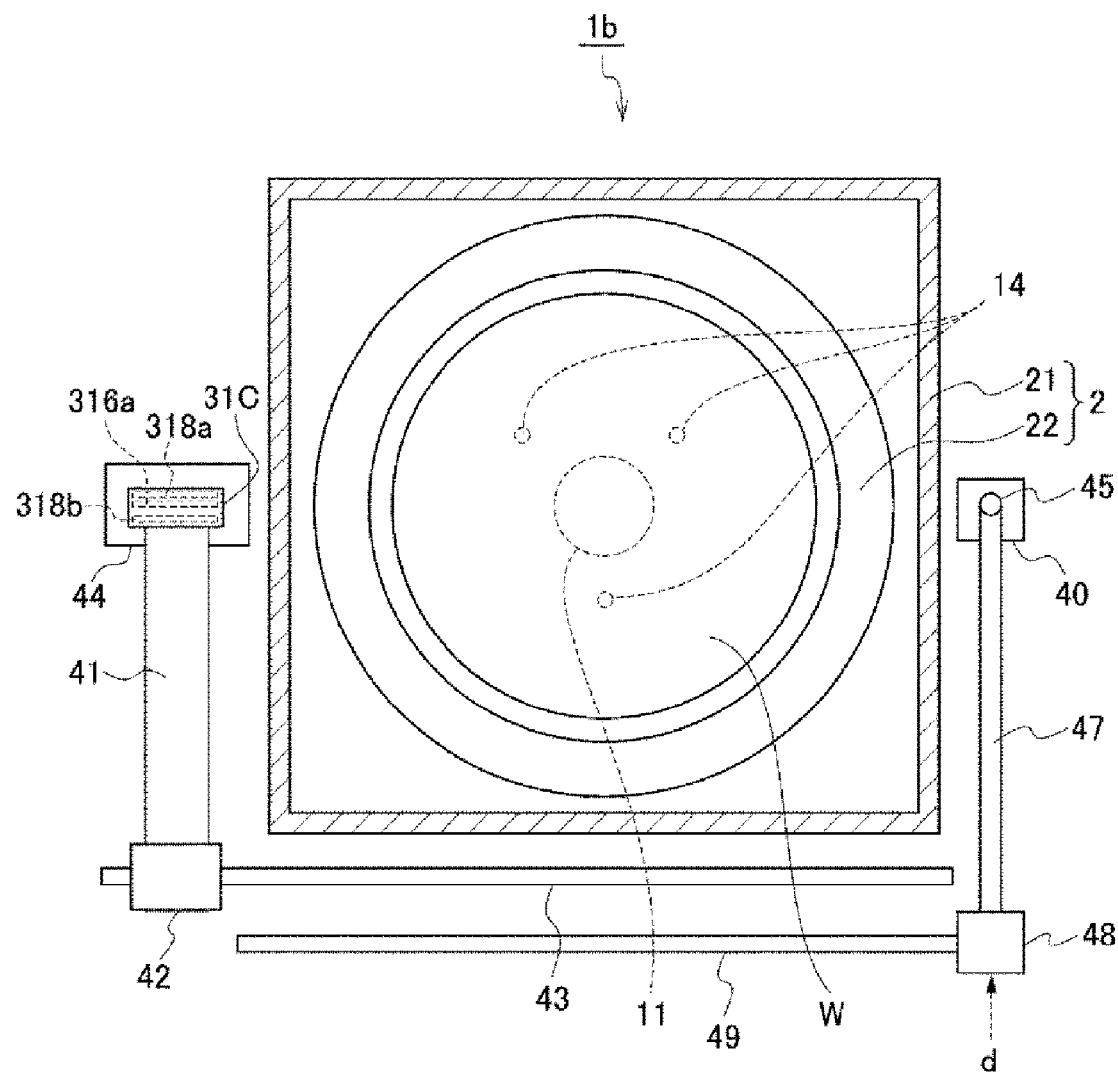
FIG. 15 is a plan view of a developing apparatus according to a second exemplary embodiment.
Figure 16:
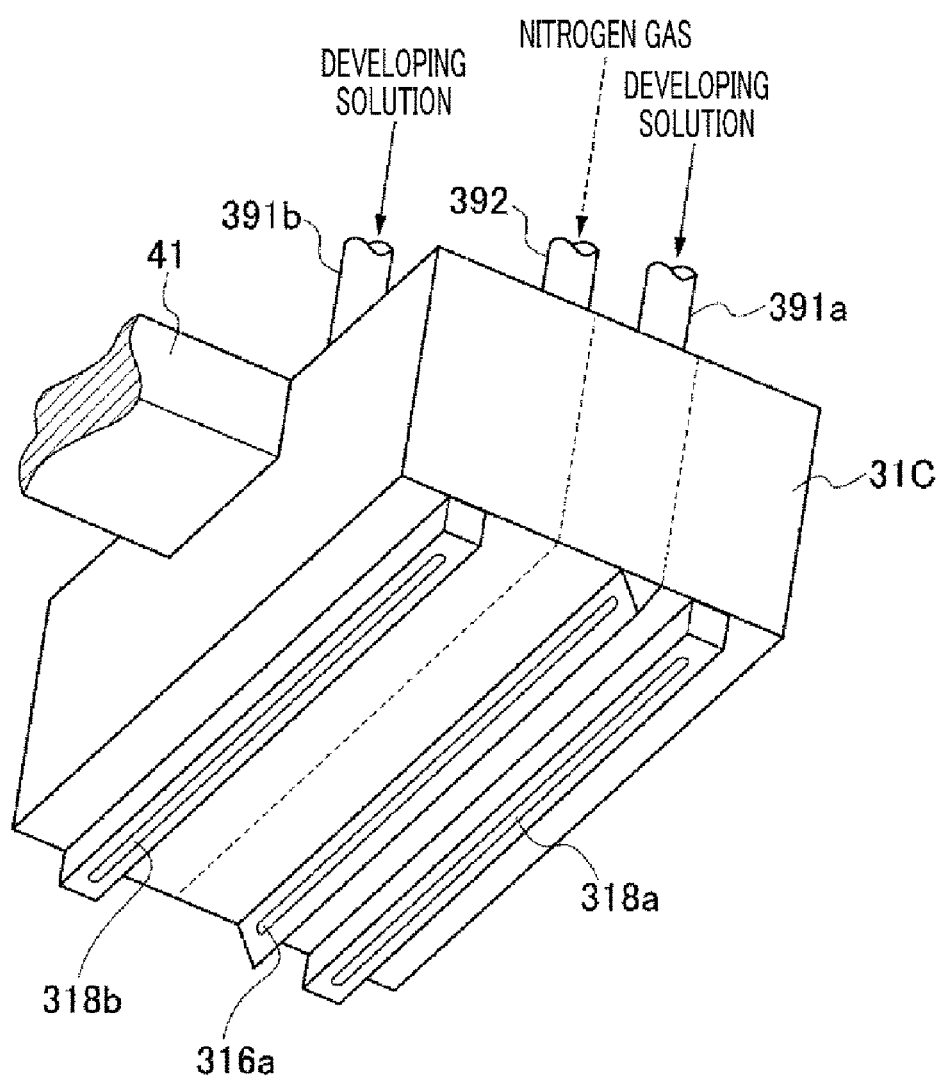
FIG. 16 is a perspective view of a slit nozzle unit according to the second exemplary embodiment.

As shown in FIG. 15 and FIG. 16, the slit nozzle unit 31C of the second exemplary embodiment has a main body fixed to the tip end of the arm 41. When viewed from the arm 41, this main body of the slit nozzle unit 31C has a thin and long rectangular shape elongated in a left-right direction. A width of the slit nozzle unit 31C in the left-right direction is shorter than a radius of a wafer W to be processed. Two developing solution supply slits 318a and 318b, which are elongated in straight line shapes in the left-right direction, are arranged on a bottom surface of the slit nozzle unit 31C substantially in a parallel with each other while spaced apart from each other in a forward-backward direction. Further, a nitrogen gas discharge slit 316a as a gas discharge hole, which is extended in a straight line shape substantially in parallel with the developing solution supply slits 318a and 318b, is also provided on the bottom surface of the slit nozzle unit 31C to be located between the two developing solution supply slits 318a and 318b.

As depicted by dashed lines in FIG. 16, the inside of the main body of the slit nozzle unit 31C is partitioned in correspondence to the slits 318a, 318b and 316a. A developing solution is supplied from the aforementioned developing solution supply source 300A to the developing solution supply slits 318a and 318b through developing solution supply paths 391a and 391b, respectively, and a nitrogen gas is supplied from the nitrogen gas supply source 300B to the nitrogen gas discharge slit 316a through a nitrogen gas supply path 392. That is, in the present exemplary embodiment, the first developing solution supply slit 318a corresponds to the first developing solution supply unit, and the second developing solution supply slit 318b corresponds to the second developing solution supply unit. Further, the nitrogen gas discharge slit 316a corresponds to a gas supply unit.

As shown in FIG. 16, the two developing solution supply slits 318a and 318b are protruded downwards to be lower than the bottom surface of the slit nozzle 31C, and configured to discharge the developing solution downwards in a direction orthogonal to the wafer W held on the spin chuck 11. Meanwhile, the nitrogen gas discharge slit 316a is configured to discharge a nitrogen gas diagonally downwards toward a rear side where the second developing solution supply slit 318b is located. Further, the nitrogen gas discharge slit 316a is positioned to be closer to the first developing solution supply slit 318a between the two developing solution supply slits 318a and 318b which are distanced apart from each other in the forward-backward direction.

Here, the direction in which the nitrogen gas discharge slit 316a discharges the nitrogen gas may not be limited to being diagonally downwards. For example, like the developing solution supply slits 318a and 318b, the nitrogen gas discharge slit 316a may discharge the nitrogen gas straightly downwards.

As illustrated in FIG. 15, the arm 41 holds the slit nozzle unit 31C at a position from which it can pass through a region above the central portion of the wafer W held on the spin chuck 11. Further, the slits 318a, 318b and 316a provided at the slit nozzle unit 31C are elongated in a direction according to a moving direction of the slit nozzle unit 31C.

In the developing apparatus 1b of the second exemplary embodiment, the aforementioned nozzle driving unit 42 and the substrate rotating unit composed of the spin chuck 11 or the like constitutes the moving device configured to move the wafer W and the slit nozzle unit 31C relatively to each other.

Now, a developing process for a wafer W using the above-described slit nozzle unit 31C will be explained with reference to FIG. 17 to FIG. 20. On a time chart of FIG. 19, a time period of supplying the developing solution from each of the developing solution supply slits 381a and 131b, a time period of supplying the nitrogen gas from the nitrogen gas discharge slits 316a and a time period of moving the slit nozzle unit 3C are indicated by band charts. Further, in the present exemplary embodiment, a rotational speed of the wafer W is only indicated in the graph.

First, the slit nozzle unit 31C is moved to a position above the central portion of the wafer W that is stopped, and the slit nozzle unit 31C is then lowered down to a preset position. Then, a rotation of the wafer W is started, and the slit nozzle unit 31C is started to be moved toward the periphery of the wafer W (time t1 in FIG. 19). At time t2 when the wafer W rotates at a preset rotational speed, a supply of the developing solution from the first developing solution supply slit 318a and a supply of the nitrogen gas from the nitrogen gas discharge slit 316a are begun. Here, as for the timing for initiating the supply of the developing solution, it may be desirable to start supplying the developing solution before one end of the first developing solution supply slit 318a at the central side of the wafer W is escaped from a position where it covers a region above the center of the wafer W. As a result, a liquid puddle 30 of the developing solution can be formed on the central portion of the wafer W as well.

Figure 17:
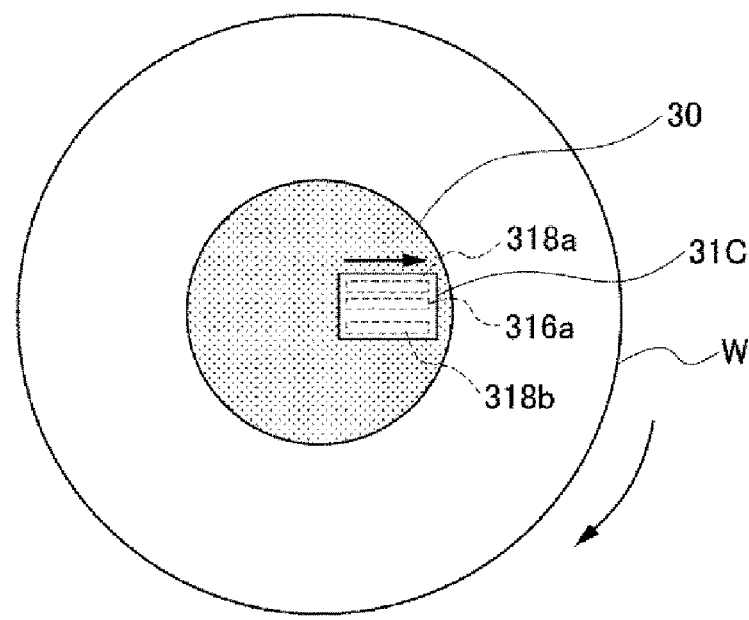
FIG. 17 is a first explanatory diagram for describing a developing process according to the second exemplary embodiment.

As shown in FIG. 17, the first developing solution supply slit 318a is extended in the radial direction of the wafer W while the developing solution is discharged from the first developing solution supply slit 318a onto the wafer W being rotated. Therefore, a developing solution discharge region, which corresponds to the shape of the first developing solution supply slit 318a, is formed to be extended in a straight line shape in an intersecting direction with the relative moving direction of the wafer W with respect to the slit nozzle unit 31C. Further, a nitrogen gas discharge region (gas discharge region), which corresponds to the shape of the nitrogen gas discharge slit 316a, is also formed to be extended in a straight line shape in the intersecting direction with the relative moving direction of the wafer W with respect to the slit nozzle unit 31C.

Figure 19:
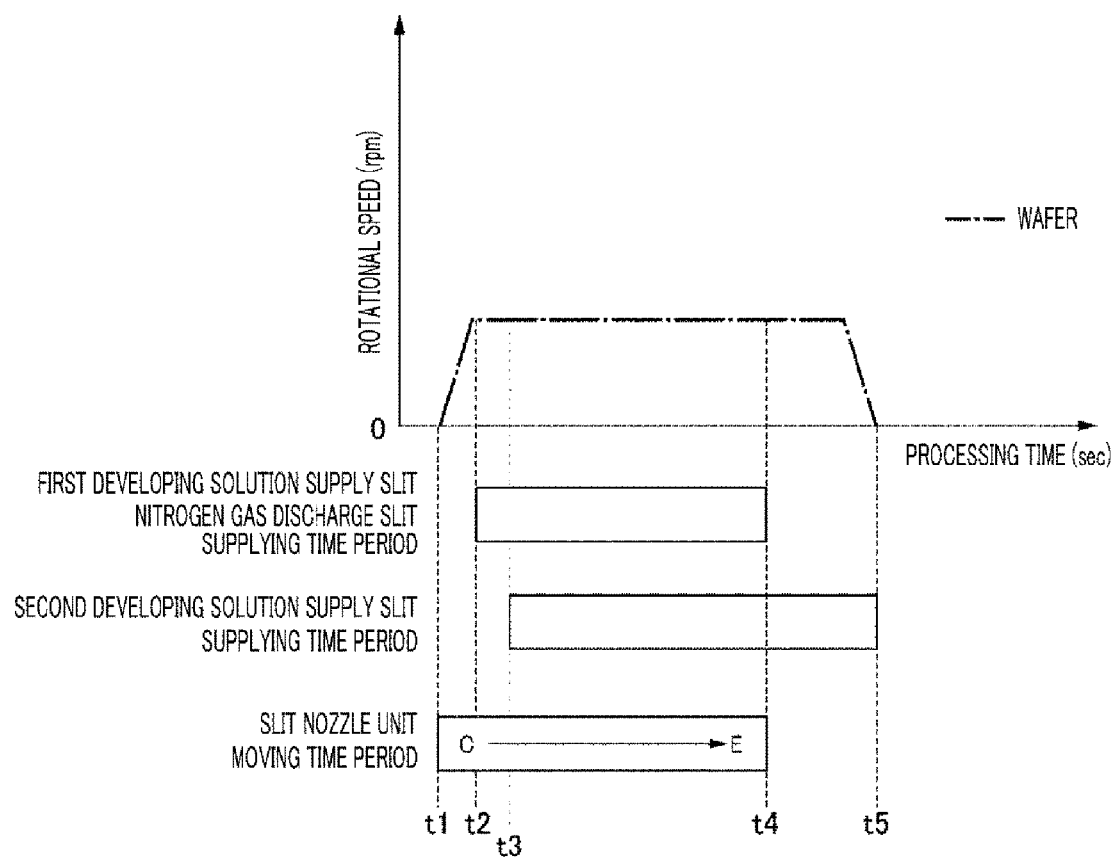
FIG. 19 is a time chart of the developing process according to the second exemplary embodiment.

At a timing upon the lapse of a preset time after supplying the developing solution from the first developing solution supply slit 318a and the nitrogen gas from the nitrogen gas discharge slit 316a, a supply of the developing solution from the second developing solution supply slit 318b is started (time t3 in FIG. 19). A developing solution discharge region, which corresponds to the shape of the second developing solution discharge slit 318b, is also formed in a straight line shape in the intersecting direction with the relative moving direction of the wafer W with respect to the slit nozzle unit 31C.

Figure 20:
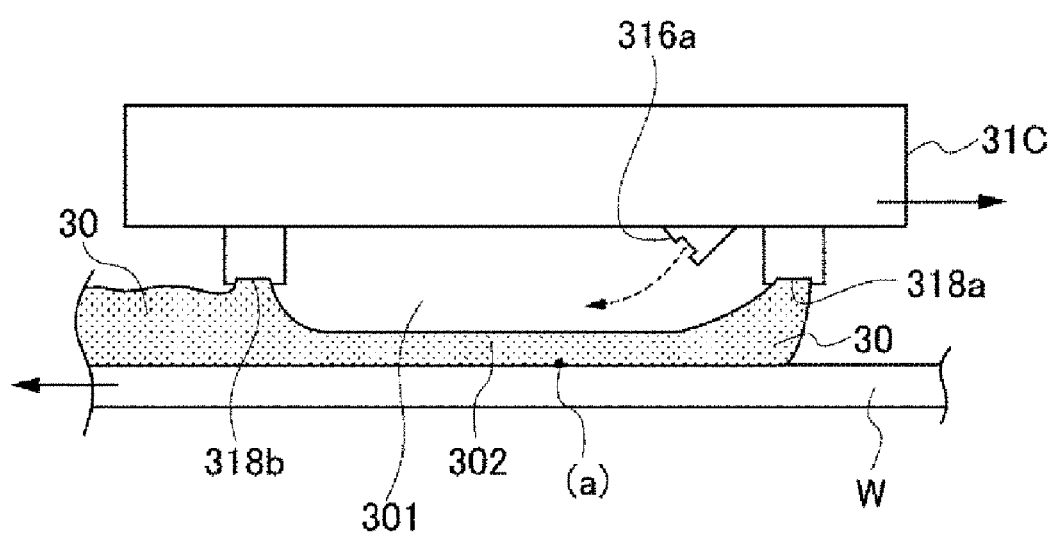
FIG. 20 is a schematic diagram illustrating an operation of the slit nozzle unit according to the second exemplary embodiment.

Accordingly, as depicted in FIG. 20, in a space under the slit nozzle unit 31C, two developing solution discharge regions are formed in the intersecting direction with the relative moving directions (indicated by arrows in FIG. 20) under the first and second developing solution discharge slits 318a and 318b, and these regions become liquid puddles 30 of the developing solution. Meanwhile, in the nitrogen gas discharge region where the nitrogen gas, which is supplied from the nitrogen gas discharge slit 316a provided between the first and second developing solution supply slits 318a and 318b, is discharged, the developing solution is pushed out and a gas-phase region 301 is formed. As a consequence, there is formed a thin film portion 302 where the developing solution film forming the liquid puddle becomes thinner.

At this time, if a point (a) on the wafer W is noted, for example, this point (a) passes through the liquid puddle 30 in the developing discharge region of the first developing liquid supply slit 318a, the thin film portion 302 in the nitrogen gas discharge region of the nitrogen gas discharge slit 316a and the liquid puddle 30 in the developing solution discharge region of the second developing solution supply slit 318b in sequence. As a result, as in the operation of the pad nozzle 31 described in FIG. 10, supplying of a new developing solution and pushing of the developing solution having the reduced reactivity are performed alternately. Thus, the reactivity of the developing solution in contact with the point (a) can be maintained high on the time average, and a processing time required for the developing process can be shortened.

Figure 18:
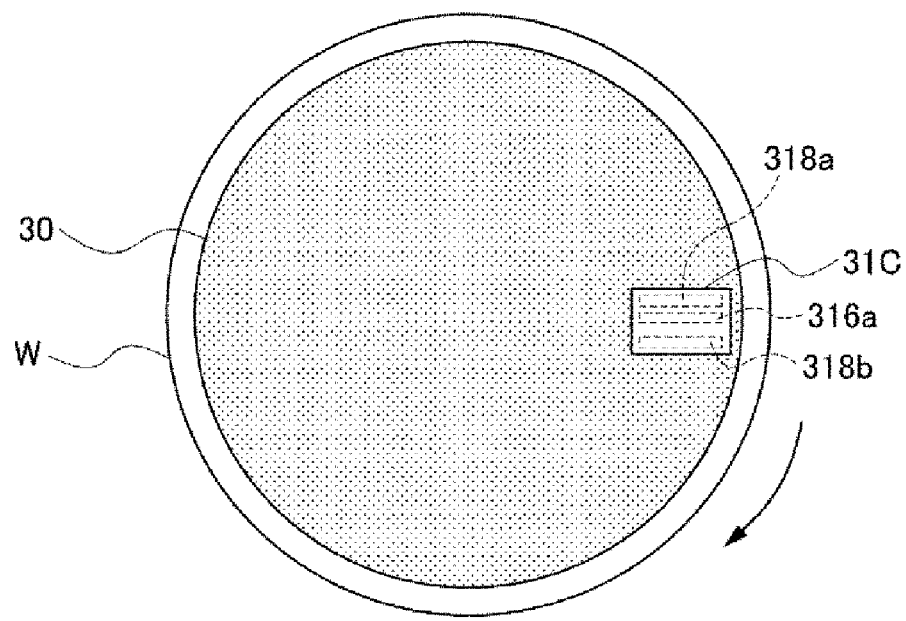
FIG. 18 is a second explanatory diagram for describing the developing process according to the second exemplary embodiment.

If the entire surface of the wafer W is covered with the liquid puddle 30 by moving the slit nozzle unit 31C toward the periphery of the wafer W while supplying the developing solution from the first and second developing solution supply slits 318a and 318b and supplying the nitrogen gas from the nitrogen gas discharge slits 316a, the movement of the slit nozzle unit 31C, the supply of the developing solution from the first developing solution supply slit 318a and the supply of the nitrogen gas from the nitrogen gas discharge slit 316a are stopped (FIG. 18 and time t4 in FIG. 19). Then, upon the lapse of a preset time, the supply of the developing solution from the second developing solution supply slit 318b is also stopped at a timing when the rotation of the wafer W is stopped (time t5 of FIG. 19).

After the supply of the developing solution from the slit nozzle unit 31C is stopped, a reaction between the liquid puddle 30 of the developing solution and a resist film further progresses, which is the same as stated above with reference to FIG. 8. Then, after a predetermined time elapses, the wafer W is rotated and a cleaning liquid is supplied, so that the developing solution is removed from the wafer W.

The present embodiment is not limited to the configuration of providing only a single set of slit nozzle unit 31C as in the developing apparatus 1b shown in FIG. 15. By way of example, the wafer W may be processed by providing two sets of slit nozzle units 31C, as in the developing apparatus 1a shown in FIG. 11.

Further, it is not essential to process the wafer W while moving the slit nozzle unit 31C by the arm 41. As an example, there may be provided a slit nozzle unit 31C which has a first developing solution supply slit 318a, a second developing solution supply slit 318b and a nitrogen gas discharge slit 316a, each having a width larger than a radius of the wafer W in the left-right direction. Then, the slit nozzle unit 31C is disposed such that these slits 318a, 318b and 316a cover the radius of the wafer W. If a developing solution and a nitrogen gas are respectively supplied from the slits 318a, 318b and 316a while rotating the wafer W, the same effect as obtained in FIG. 20 can be achieved, and the liquid puddle 30 can be formed on the entire surface of the wafer W.

Figure 21:
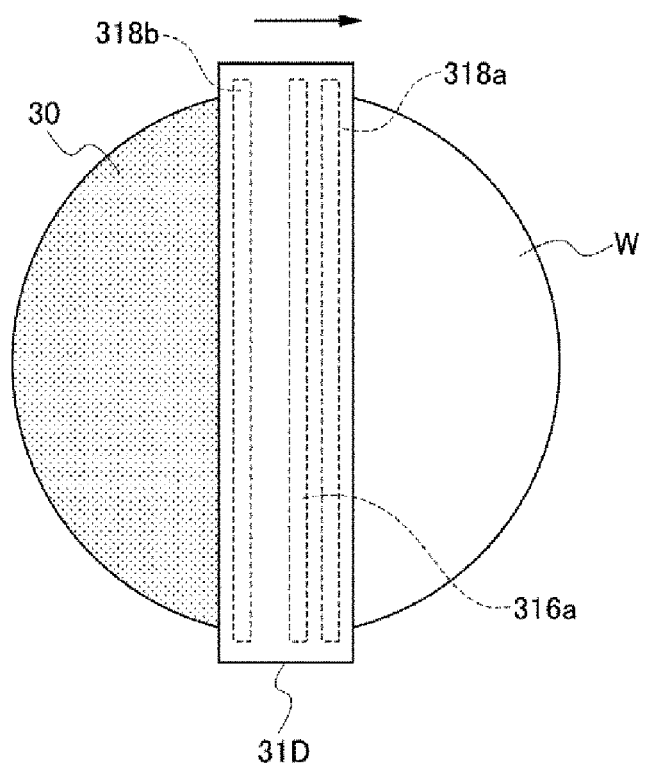
FIG. 21 is an explanatory diagram illustrating a modification example of the developing apparatus according to the second exemplary embodiment.

Further, as shown in FIG. 21, there may be provided a slit nozzle unit 31D which has a first developing solution supply slit 318a, a second developing solution supply slit 318b and a nitrogen gas discharge slit 316a, each having a length covering a region ranging from one end of the wafer W to the other end thereof. With this configuration as well, the liquid puddle 30 can be formed by moving the slit nozzle unit 31D from one side of the wafer W to the other side thereof by a non-illustrated nozzle driving unit (moving device) without rotating the wafer W.

Furthermore, the way to form the developing solution discharge region and the nitrogen gas discharge region that are extended in the straight line shape in the intersecting direction with the relative moving direction of the wafer W in the slit nozzle units 31C and 31D may not be limited to the case of using the slits 318a, 318b and 316a. For example, a multiple number of supply holes may be arranged in a straight line shape along the intersecting direction, and the developing solution and the nitrogen gas may be supplied from these multiple number of supply holes at the same time. In this way, as well, the developing solution discharge region and the nitrogen gas discharge region extended in a straight line shape can still be formed.

In addition, the way to form the nitrogen gas discharge region between the plural developing solution discharge regions may not be limited to the configuration, as in the slit nozzle unit 31C shown in FIG. 16, where the single nitrogen gas discharge slit 316a is provided between the single first developing solution supply slit 318a and the single second developing solution supply slit 318b. For example, multiple nitrogen gas discharge slits 316b may be provided between multiple first developing solution supply slits 318a and multiple second developing solution supply slits 318b. Additionally, by extending the width of the slit nozzle unit 31C in the forward-backward direction, sets of nitrogen gas discharge slits and developing solution supply slits may be further provided in front of the first developing solution supply slit 318a or at the back of the second developing solution supply slit 318b.

Third Exemplary Embodiment

In a developing process according to a third exemplary embodiment, a developing apparatus 1a equipped with two pad nozzles 31A and 31B as shown in FIG. 11, for example, is used, and a liquid puddle 30 of a developing solution or a thin film portion 302 is formed by using relative movements of pad nozzles 31A and 31B. Since a configuration of the developing apparatus 1a is the same as that shown in FIG. 11, redundant description will be omitted.

The developing process according to the third exemplary embodiment will be discussed with reference to FIG. 22 to FIG. 27. In the present exemplary embodiment, the second pad nozzle 31B is moved to a position above the central portion of the wafer W, and the first pad nozzle 31A is moved to a position (marked as "M" on a band chart of FIG.

Figure 22:
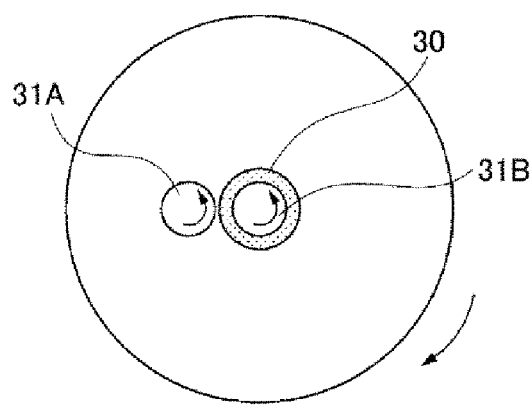
FIG. 22 is a first explanatory diagram for describing a developing process according to a third exemplary embodiment.

26) slightly deviated from the position above the central portion of the wafer W, as depicted in FIG. 22.

Figure 26:
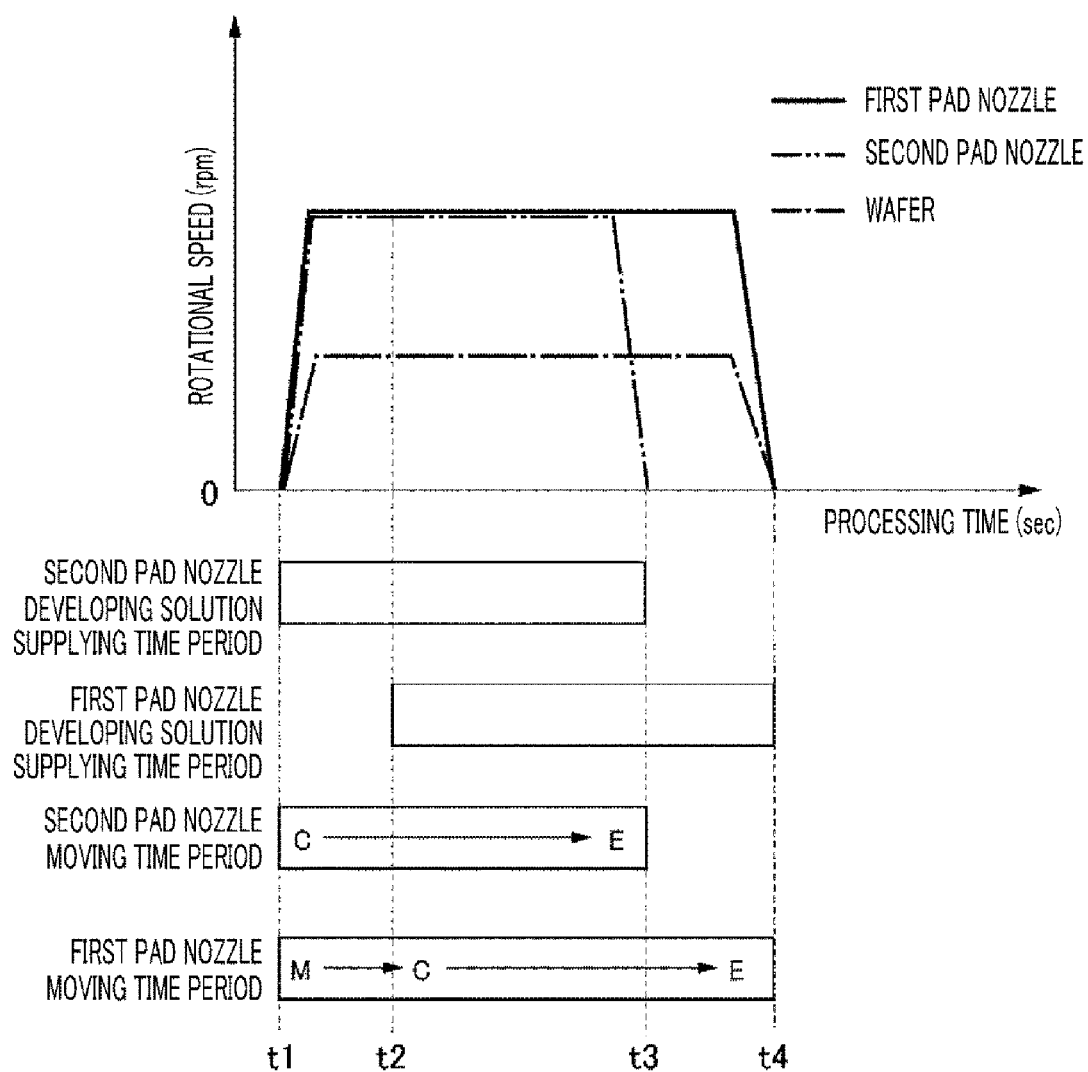
FIG. 26 is a time chart of the developing process according to the third exemplary embodiment.

Then, the wafer W and both pad nozzles 31A and 31B are rotated, and the developing solution is started to be supplied from the developing solution discharge holes 314 of the second pad nozzle 31B toward the central portion of the wafer W (FIG. 22 and time t1 in FIG. 26). Concurrently with these operations, the second pad nozzle 31B is moved from the central portion of the wafer W toward the periphery thereof, and the first pad nozzle 31A is moved in the same direction as that of the second pad nozzle 31B from the position slightly deviated from the aforementioned central position. At this time, a moving speed of the first pad nozzle 31A is controlled to be lower than that of the second pad nozzle 31B.

Figure 23:
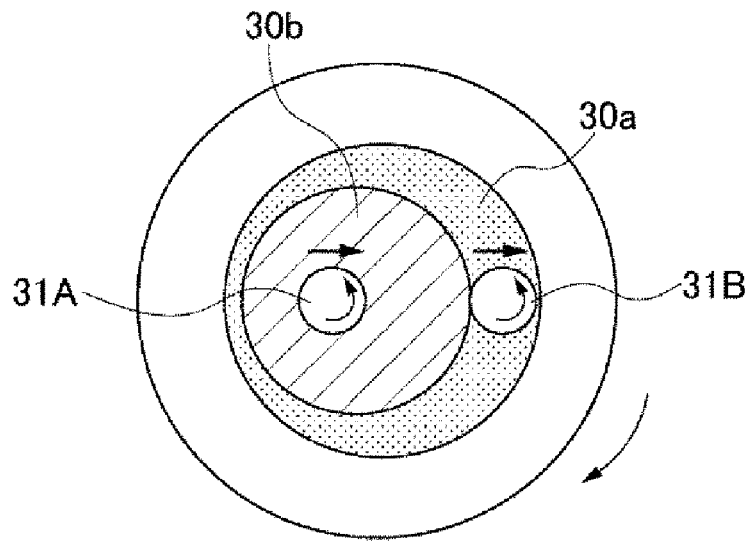
FIG. 23 is a second explanatory diagram for describing the developing process according to the third exemplary embodiment.
Figure 27:
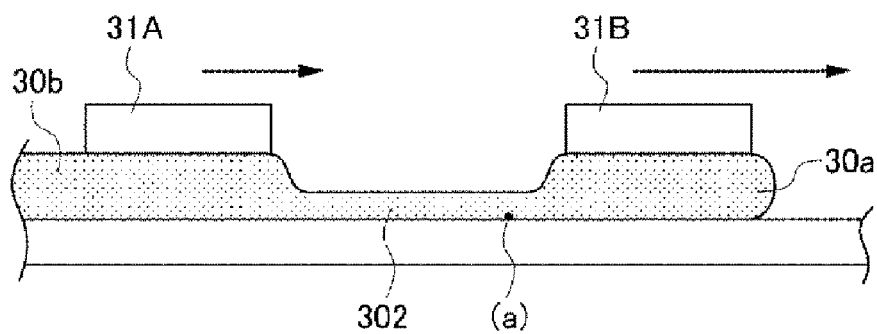
FIG. 27 is a schematic diagram illustrating an operation of the developing process according to the third exemplary embodiment.

At a timing when the first pad nozzle 31A is moved to a position in the vicinity of the central portion of the wafer W, a supply of the developing solution from the first pad nozzle 31A is started (FIG. 23 and time t2 in FIG. 26). Here, if the developing solution is supplied while moving the second pad nozzle 31B, the developing solution of the liquid puddle 30a at the central side of the wafer W is flown toward the peripheral side thereof by inertia exerted on the liquid puddle 30a which is diffused on the surface of the wafer W. Resultantly, a thin film portion 302 where the developing solution film becomes thinner is formed at the central side thereof, as illustrated in FIG. 27.

If the developing solution is supplied from the first pad nozzle 31A at an upstream position in the moving direction of the second pad nozzle 31B, a new developing solution is supplied onto the thin film portion 302 to form a liquid puddle 30b again. As a result, a point (a) on the wafer W passes through the liquid puddle 30a formed by the second pad nozzle 31B, the thin film portion 302 formed along with the movement of the second pad nozzle 31B and the liquid puddle 30b formed by the first pad nozzle 31A in sequence. Accordingly, as in the operation of the first pad nozzle 31 described above with reference to FIG. 10, supplying of the new developing solution and pushing of the developing solution with reduced reactivity are performed alternately. Thus, the reactivity of the developing solution in contact with the point (a) can be maintained high on the time average and a processing time required for the developing process can be shortened.

Figure 24:
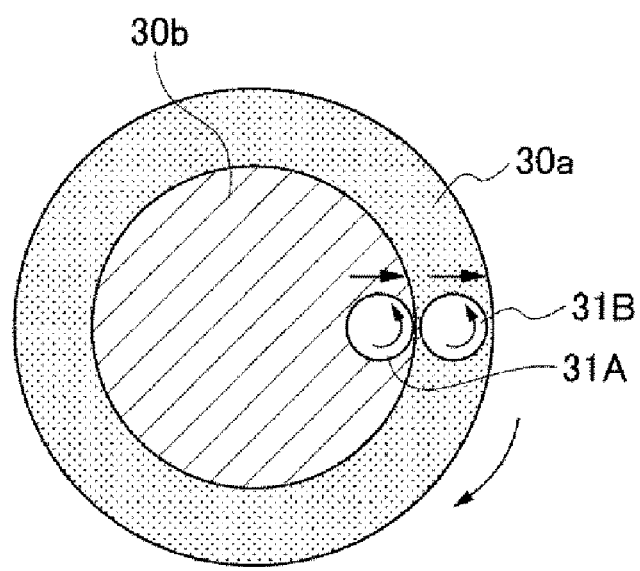
FIG. 24 is a third explanatory diagram for describing the developing process according to the third exemplary embodiment.

The developing solution from the second pad nozzle 31B and the supply of the developing solution from the first pad nozzle 31A at the upstream position in the moving direction of the second pad nozzle 31B are supplied as stated above. If the second pad nozzle 31B reaches the periphery of the wafer W, the rotation of the second pad nozzle 31B and the supply of the developing solution therefrom are stopped (FIG. 24 and time t3 in FIG. 26). Then, the second pad nozzle 31B is retreated to the standby region 44.

Figure 25:
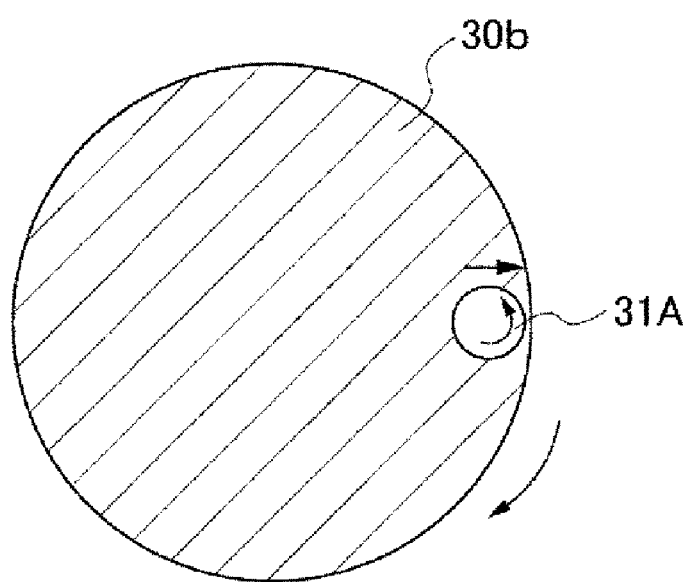
FIG. 25 is a fourth explanatory diagram for describing the developing process according to the third exemplary embodiment.

During this time period, the first pad nozzle 31A continues to supply the developing solution while being moved toward the periphery of the wafer W along the moving path of the second pad nozzle 31B. If the first pad nozzle 31A reaches the periphery of the wafer W, the rotation of the first pad nozzle 31A and the supply of the developing solution therefrom are stopped (FIG. 25 and time t4 in FIG. 26). As a result, the entire surface of the wafer W gets covered with the liquid puddle 30b.

After the supply of the developing solution from the first pad nozzle 31A is stopped, a reaction between the liquid puddle 30 of the developing solution and a resist film further progresses, which is the same as stated above with reference to FIG. 8. Then, after a predetermined time elapses, the wafer W is rotated and a cleaning liquid is supplied, so that the developing solution is removed from the wafer W.

In the above-described developing process, the second pad nozzle 31B corresponds to the first developing solution supply unit, and the first pad nozzle 31A corresponds to the second developing solution supply unit. Further, the two nozzle driving units 42 shown in FIG. 11 correspond to a first supply position adjusting unit and a second supply position adjusting unit for adjusting supply positions of the developing solution from the pad nozzles 31B and 31A, respectively.

Further, it may not be essential to set the moving speed of the first pad nozzle 31A to be lower than that of the second pad nozzle 31B. The moving speeds of both pad nozzles 31A and 31B may be set to be same. In such case, the movement of the first pad nozzle 31A needs to be started at a timing when the first pad nozzle 31A does not catch up with the second pad nozzle 31B, i.e., such that the first pad nozzle 31A follows the second pad nozzle 31B from behind.

In the developing method described above with reference to FIG. 22 to FIG. 27, since the entire surface of the wafer W is made to come into contact with the liquid puddle 30a, the thin film portion 302 and the liquid puddle 30b in sequence by using the relative movements of the second pad nozzle 31B and the first pad nozzle 31A, an efficient developing process can be performed. Therefore, without supplying the nitrogen gas from the nitrogen gas discharge holes 316 of the pad nozzle 31 shown in FIG. 4, for example, the thin film portion 302 is formed between the second pad nozzle 31B and the first pad nozzle 31A.

As such, it is not essential to form the nitrogen gas discharge holes 316 at the pad nozzle 31. For example, it may be possible to use the nozzle head unit 3 having a configuration in which the developing solution supply path 311 formed in the pad nozzle 31 shown in FIG. 3, for example, is opened toward the bottom surface of the developing solution supplying surface 310. In this configuration, the developing solution supplied from the developing solution supply path 311 is diffused in a gap between the developing solution supplying surface 310 and the wafer W, and then, is agitated by rotating the pad nozzle 31. Further, by using the pad nozzle 31 provided with the nitrogen gas discharge holes 316, a supply of a new developing solution and a formation of a thin film portion 302 are repeated in a region under each of the pad nozzle 31A and 31B, so that an efficient developing process can be performed.

Moreover, in the developing method described above with reference to FIG. 22 to FIG. 27, the slit nozzle unit 31C shown in FIG. 16, etc. may also be used, or a straight nozzle having a developing solution supply pipe with an open bottom may also be used.

Further, it is not essential to form the liquid puddle 30b by supplying the developing solution from the first pad nozzle 31A while moving the first pad nozzle 31A along the moving path of the second pad nozzle 31B. For example, the developing solution may be supplied from the first pad nozzle 31A which is stopped above the central portion of the wafer W at the upstream position in the moving direction of the second pad nozzle 31B.

EXPERIMENTAL EXAMPLES

Experiments

The developing solution is supplied by using the pad nozzle 31 which is provided at the nozzle head unit 3 to be rotatable about the vertical axis as shown in FIG. 3 and has a developing solution supply path 311 directly opened to the bottom surface of the pad nozzle 31. Then, a relationship between a timing for rotating the pad nozzle 31 or a rotation time and a CD of a pattern formed under the pad nozzle 31 is investigated. The developing solution supplying surface 310 of the pad nozzle 31 is not provided with the developing solution discharge holes 314 and the nitrogen gas discharge holes 316.

A. Conditions for Experiments

Reference Example 1-1

The developing solution is supplied by using the pad nozzle 31 having a diameter of 10 cm for a total time of 60 seconds, and the pad nozzle 31 is rotated only for the last 20 seconds.

Reference Example 1-2

During the developing solution supply time of 60 seconds, the pad nozzle 31 is rotated only for the mid 20 seconds.

Reference Example 1-3

During the developing solution supply time of 60 seconds, the pad nozzle 31 is rotated only for the first 20 seconds.

Reference Example 1-4

During the developing solution supply time of 60 seconds, an operation of rotating the pad nozzle 31 for 5 seconds and stopping the rotation of the pad nozzle 31 for the subsequent 10 seconds is repeated 4 times.

Reference Example 1-5

The developing solution is supplied for 50 seconds, and the pad nozzle 31 is continuously rotated during this whole time period.

Reference Example 1-6

During the developing solution supply time of 60 seconds, the pad nozzle 31 is rotated only for the first 1 second.

Reference Example 1-7

During the developing solution supply time of 60 seconds, the pad nozzle 31 is rotated only for the first 5 seconds.

Comparative Example 1-1

The developing solution is supplied for 50 seconds, and the pad nozzle 31 is not rotated during this whole time period.

B. Experimental Results

Figure 28:
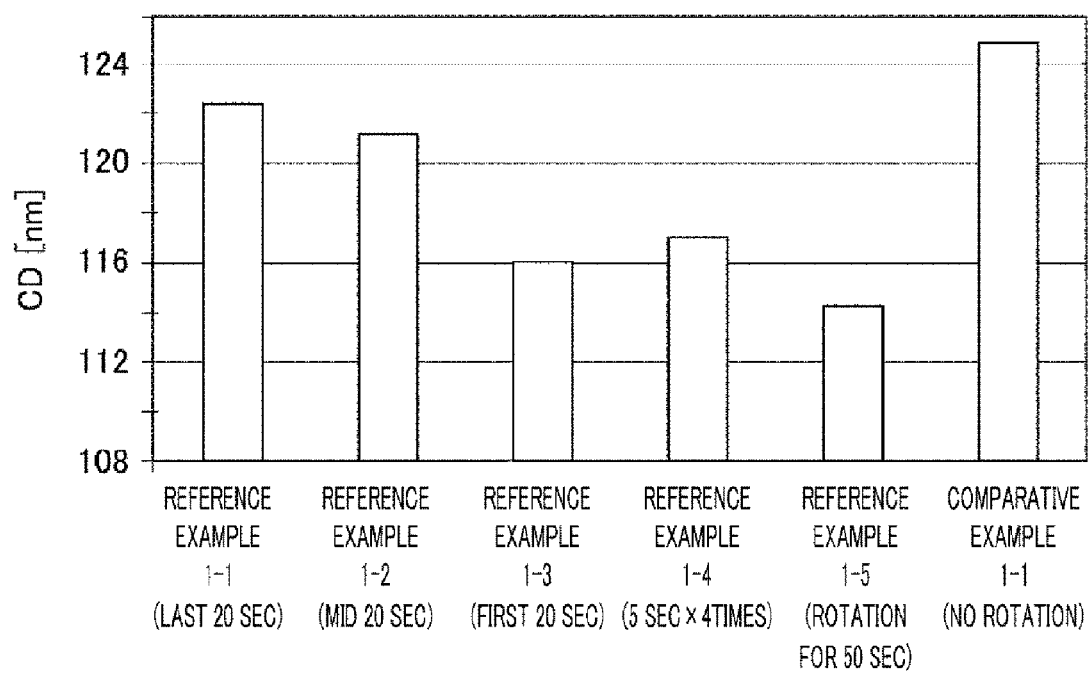
FIG. 28 is a first explanatory diagram showing an experiment result.
Figure 29:
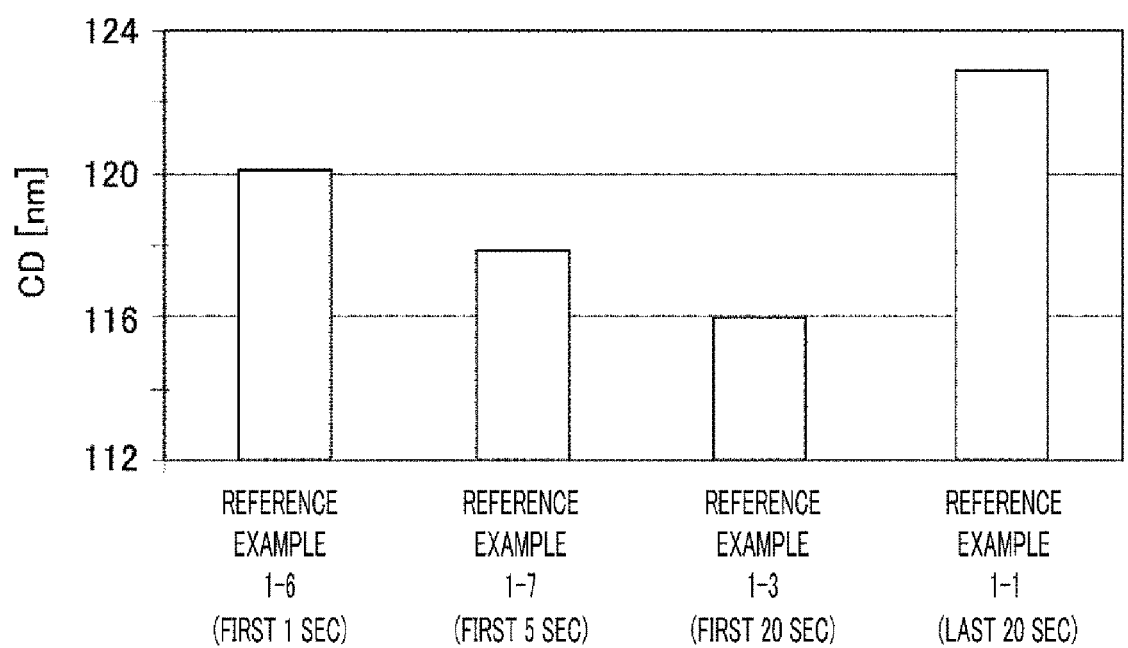
FIG. 29 is a second explanatory diagram showing an experiment result.

FIG. 28 shows experimental examples according to Reference examples 1-1 to 1-5 and Comparative example 1-1, and FIG. 29 shows experimental examples according to Reference examples 1-1, 1-3, 1-6 and 1-7. In each chart, a height of a bar graph represents a CD (nm) of a developed pattern. A smaller CD value indicates that the developing process is performed.

According to the experimental results presented in FIG. 28, the developing process is found to be performed as the rotation time of the pad nozzle 31 increases (Reference example 1-5). Meanwhile, in cases that the rotation times of the pad nozzle 31 are same, the developing process is found to be performed when rotating the pad nozzle 31 at a timing when the supply of the developing solution is started (Reference examples 1-1 to 1-3). Further, as depicted in FIG. 29, even if the rotation time of the pad nozzle 31 is short, in the case when the pad nozzle 31 is rotated immediately after the supply of the developing solution is started, a higher effect of performing the developing process can be obtained (Reference examples 1-6, 1-7 and 1-1), as compared to the case when the pad nozzle 31 is rotated for long in the last of the developing solution supply time.

By rotating the pad nozzle 31, the liquid puddle 30 of the developing solution formed between the developing solution supplying surface 310 and the wafer W can be agitated. As a result, the concentration of the developing solution can be uniform. At this time, the experimental result that a higher effect of performing the developing process can be obtained when agitating the developing solution immediately after the supply of the developing solution is begun indicates that the reactivity of the developing solution is reduced by the components dissolved immediately after it comes into contact with the resist film. Accordingly, as in the exemplary embodiments, by forming the liquid puddle 30 of the developing solution, forming the thin film portion 302 by pushing out the used developing solution immediately thereafter, and then, supplying a new developing solution, it is possible to obtain the effect of performing the developing process while suppressing the reactivity of the developing solution from being reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A developing apparatus, comprising:
 a substrate holding unit configured to horizontally hold a substrate having thereon a resist film that is exposed to light;
 a first developing solution supply unit configured to form a developing solution film by supplying a developing solution onto a surface of the substrate held on the substrate holding unit;
 a pushing mechanism configured to thin the developing solution film by pushing out the developing solution containing components dissolved from the resist;
 a second developing solution supply unit configured to supply a new developing solution onto the developing solution film which is pushed out and thinned by the pushing mechanism;
 a nozzle head unit, disposed to face the surface of the substrate held on the substrate holding unit, having a developing solution supplying surface provided with a multiple number of developing solution supplying holes; and
 a moving device configured to move the substrate held on the substrate holding unit and the nozzle head unit relatively to each other,
 wherein the moving device includes a nozzle rotating unit configured to rotate the developing solution supplying surface about a vertical axis and a nozzle driving unit configured to move the nozzle head unit from a central portion of the substrate to a periphery thereof, and wherein the nozzle rotating unit moves simultaneously with the nozzle driving unit.

2. The developing apparatus of claim 1,
wherein the pushing mechanism includes a gas supply unit configured to push out the developing solution by discharging a gas onto a surface of the developing solution film.

3. The developing apparatus of claim 2, wherein the gas supply unit is formed of gas discharge holes that are arranged to divide, along a relative moving direction of the nozzle head unit with respect to the substrate, the developing solution supplying surface provided with the developing solution supplying holes into multiple developing solution supplying hole formation areas, and
the developing solution supplying hole formation areas, which are divided by the gas discharge holes, constitute the first developing solution supply unit and the second developing solution supply unit.

4. The developing apparatus of claim 3,
wherein the moving device further includes a substrate rotating unit configured to rotate the substrate held on the substrate holding unit about the vertical axis, and
the gas discharge holes are formed to divide the developing solution supplying surface provided with the developing solution supplying holes into the developing solution supplying hole formation areas along a circumference thereof in a rotational direction of the developing solution supplying surface.

5. The developing apparatus of claim 3,
wherein in the developing solution supplying hole formation area, there are provided the developing solution supplying holes such that developing solution supplying regions, each of which is extended in a straight line shape in an intersecting direction with the relative moving direction of the nozzle head unit with respect to the substrate, are formed and the developing solution supplying regions are arranged with a gap therebetween in the relative moving direction, and
the gas discharge holes are arranged to form gas discharge regions extended between the developing solution supplying regions along the developing solution supplying regions.

6. The developing apparatus of claim 5,
wherein the moving device further includes a substrate rotating unit configured to rotate the substrate about a vertical axis, and
the nozzle head unit is provided with the developing solution supplying holes arranged to form the developing solution supplying regions, having a length shorter than a distance from the central portion of the substrate to the periphery thereof, extended from the central portion of the substrate toward the periphery thereof.

7. The developing apparatus of claim 5,
wherein
the nozzle head unit is provided with the developing solution supplying holes such that the developing solution supplying regions have a length covering a width of the substrate.

8. The developing apparatus of claim 1,
wherein the pushing mechanism includes:
a substrate rotating unit configured to rotate the substrate held on the substrate holding unit about a vertical axis;
a first supply position adjusting unit configured to adjust a supply position of the developing solution from the first developing solution supply unit;
a second supply position adjusting unit configured to adjust a supply position of the developing solution from the second developing solution supply unit; and
a controller configured to output a control signal to perform a process of forming a developing solution film and thinning the developing solution film by generating, on the surface of the substrate being rotated, a flow of the developing solution pushed out from the central portion of the substrate toward the periphery thereof by way of moving a supply position of the developing solution from the first developing solution supply unit along a radial direction of the substrate; and a process of supplying a new developing solution by supplying the developing solution from the second developing solution supply unit at an upstream position in a moving direction of the supply position of the developing solution from the first developing solution supply unit.

9. The developing apparatus of claim 8,
wherein the controller outputs the control signal such that the supply position of the developing solution from the second developing solution supply unit is moved in the same direction as that of the developing solution from the first developing solution supply unit and a moving speed of the supply position of the developing solution from the second developing solution supply unit is set to be lower than that of the supply position of the developing solution from the first developing solution supply unit.

10. A developing apparatus, comprising:
a substrate holding unit configured to horizontally hold a substrate having thereon a resist film that is exposed to light;
a first developing solution supply unit configured to form a developing solution film by supplying a developing solution onto a surface of the substrate held on the substrate holding unit;
a pushing mechanism configured to thin the developing solution film by pushing out the developing solution containing components dissolved from the resist;
a second developing solution supply unit configured to supply a new developing solution onto the developing solution film which is pushed out and thinned by the pushing mechanism;
a nozzle head unit, disposed to face the surface of the substrate held on the substrate holding unit, having a developing solution supplying surface provided with a multiple number of developing solution supplying holes; and
a moving device configured to move the substrate held on the substrate holding unit and the nozzle head unit relatively to each other,
wherein the moving device includes a nozzle rotating unit configured to rotate the developing solution supplying surface about a vertical axis and a nozzle driving unit configured to move the nozzle head unit from one end of the substrate to the other end thereof, and wherein the nozzle rotating unit moves simultaneously with the nozzle driving unit.

11. A developing method performed by using the developing apparatus of claim 1, comprising:
forming the developing solution film by supplying the developing solution onto the surface of the substrate having thereon the resist film that is exposed to light;

thinning the developing solution film by pushing out the developing solution containing components dissolved from the resist film; and supplying the new developing solution onto the thinned developing solution film.

12. The developing method of claim 11, wherein the thinning of the developing solution film is performed by discharging a gas onto a surface of the developing solution film.

13. The developing method of claim 11, wherein the forming of the developing solution film and the thinning of the developing solution film are performed together by supplying the developing solution onto the surface of the substrate being rotated about a vertical axis while moving a supply position of the developing solution along a radial direction of the substrate and by forming a flow of the developing solution pushed out from a central portion of the substrate toward a periphery thereof, and the supplying of the new developing solution is subsequently performed by supplying the developing solution at an upstream position in a moving direction of the supply position of the developing solution.

14. The developing method of claim 13, wherein in the supplying of the new developing solution, a supply position of the new developing solution is moved in the same direction as the moving direction of the developing solution in the forming of the developing solution film and a moving speed of the supply position of the new developing solution is set to be lower than that of the supply position of the developing solution.

15. A non-transitory computer-readable recording medium having stored thereon computer-executable program executed in a developing apparatus of performing a developing process by supplying a developing solution onto a surface of a substrate having thereon a resist film that is exposed to light, wherein the program performs the developing method as claimed in claim 11.

* * * * *